US012787532B2

(12) United States Patent
Liu et al.

(10) Patent No.: US 12,787,532 B2
(45) Date of Patent: Nov. 3, 2026

(54) DRIVING SUBSTRATE, LIGHT-EMITTING APPARATUS AND METHOD FOR MANUFACTURING THE SAME

(71) Applicants: BOE MLED Technology Co., Ltd., Beijing (CN); BOE TECHNOLOGY GROUP CO., LTD., Beijing (CN); BEIJING BOE TECHNOLOGY DEVELOPMENT CO., LTD., Beijing (CN)

(72) Inventors: Chao Liu, Beijing (CN); Jing Wang, Beijing (CN); Lili Wang, Beijing (CN); Shanshan Feng, Beijing (CN); Jingping Zhao, Beijing (CN); Mingming Jia, Beijing (CN); Sha Feng, Beijing (CN); Mengqing Liu, Beijing (CN); Huaimin Wang, Beijing (CN); Ming Zhai, Beijing (CN); Haiwei Sun, Beijing (CN); Qi Qi, Beijing (CN)

(73) Assignees: BOE MLED TECHNOLOGY CO., LTD., Beijing (CN); BEIJING BOE TECHNOLOGY DEVELOPMENT CO., LTD., Beijing (CN)

( * ) Notice: Subject to any disclaimer, the term of this patent is extended or adjusted under 35 U.S.C. 154(b) by 337 days.

(21) Appl. No.: 18/661,716

(22) Filed: May 13, 2024

(65) Prior Publication Data

US 2024/0395853 A1 Nov. 28, 2024

Related U.S. Application Data

(63) Continuation of application No. PCT/CN2023/096385, filed on May 25, 2023.

(51) Int. Cl.
*H10H 29/14* (2025.01)
*H05K 1/02* (2006.01)

(52) U.S. Cl.
CPC ......... *H10H 29/142* (2025.01); *H05K 1/0281* (2013.01)

(58) Field of Classification Search
CPC .... H10H 29/142; H05K 1/0281; H05K 1/189; H05K 3/0014; G09F 9/301
See application file for complete search history.

(56) References Cited

U.S. PATENT DOCUMENTS

2018/0284935 A1* 10/2018 Lee ....................... G06F 1/1656
2022/0231260 A1* 7/2022 Nishimura .......... H04M 1/0269

* cited by examiner

*Primary Examiner* — Selim U Ahmed
(74) *Attorney, Agent, or Firm* — XSENSUS LLP

(57) ABSTRACT

A driving substrate includes: a base substrate including first and second surfaces and side surfaces, at least one side surface being a selected side surface; a flexible film including a first region located on the first surface, a second region located on the second surface, and a bending region located between the first and second regions, the bending region including a first corner region, a second corner region and a side region; and a wiring layer, an electrode layer and a connection lead layer disposed in sequence on a side of the flexible film away from the base substrate. The wiring layer is located in the first region, the second region and the side region. The electrode layer includes first, second, third, and fourth electrodes. Each third electrode is electrically connected to a fourth electrode through the wiring layer. The connection lead layer includes first and second connection leads.

20 Claims, 10 Drawing Sheets

DRIVING SUBSTRATE, LIGHT-EMITTING APPARATUS AND METHOD FOR MANUFACTURING THE SAME

CROSS-REFERENCE TO RELATED APPLICATION

This application is a Bypass Continuation Application of International Patent Application No. PCT/CN2023/096385, filed on May 25, 2023, which is incorporated herein by reference in its entirety.

TECHNICAL FIELD

The present disclosure relates to the field of display technologies, and in particular, to a driving substrate, a light-emitting apparatus, and a method for manufacturing a light-emitting apparatus.

BACKGROUND

Mini light-emitting diode (Mini LED)/micro light-emitting diode (Micro LED) display apparatuses have good application prospects and can be applied to large-scale tiled display apparatuses due to their advantages such as high brightness, clear display screen and low power consumption. The size of the tiled gap in the tiled display apparatus is an important factor affecting its display effect. Therefore, the display apparatuses with narrow bezels have become one of the development trends.

SUMMARY

In an aspect, a driving substrate is provided. The driving substrate includes a base substrate including a first surface and a second surface that are opposite to each other and a plurality of side surfaces, at least one of the plurality of side surfaces being a selected side surface; a flexible film disposed on the first surface, the selected side surface, and a portion of the second surface proximate to the selected side surface, wherein the flexible film includes a first region located on the first surface, a second region located on the second surface, and a bending region located between the first region and the second region; the bending region includes a first corner region, a second corner region and a side region connecting the first region and the second region; a wiring layer, an electrode layer and a connection lead layer disposed in sequence on a side of the flexible film away from the base substrate. The wiring layer is located in the first region, the second region and the side region; the electrode layer includes a plurality of first electrodes located in the first region, a plurality of second electrodes located in the second region, a plurality of third electrodes located in the side region and proximate to the first corner region, and a plurality of fourth electrodes located in the side region and proximate to the second corner region; each third electrode is electrically connected to a fourth electrode through the wiring layer. The connection lead layer includes a plurality of first connection leads and a plurality of second connection leads; the plurality of first connection leads are located in the first corner region, and two ends of each first connection lead respectively extend to the first region and the side region; each first connection lead connects a first electrode and a third electrode; the plurality of second connection leads are located in the second corner region, and two ends of each second connection lead respectively extend to the second region and the side region; and each second connection lead connects a second electrode and a fourth electrode.

In some embodiments, the driving substrate further includes at least one inorganic layer and/or at least one organic layer disposed on the side of the flexible film away from the base substrate, wherein the inorganic layer is located in the first region, the second region and the side region, and the organic layer is located in the first region and the second region; and the connection lead layer is in contact with the flexible film.

In some embodiments, a thickness of the connection lead layer is in a range of 2 μm to 5 μm.

In some embodiments, widths of the plurality of first connection leads are approximately the same, and widths of the plurality of second connection leads are approximately the same.

In some embodiments, the driving substrate includes an organic layer, and the organic layer is disposed on a side of the electrode layer away from the base substrate.

In some embodiments, the driving substrate further includes the at least one inorganic layer, and the at least one inorganic layer includes: a buffer layer disposed between the flexible film and the wiring layer, the buffer layer being located in the first region, the side region and the second region; a first insulating layer disposed between the wiring layer and the electrode layer, the first insulating layer being located in the first region, the side region and the second region, wherein the first electrode is electrically connected to a portion of the wiring layer located in the first region through a first via hole penetrating the first insulating layer; the second electrode is electrically connected to a portion of the wiring layer located in the second region through a second via hole penetrating the first insulating layer; and the third electrode and the fourth electrode are connected to a portion of the wiring layer located in the side region through a third via hole and a fourth via hole penetrating the first insulating layer, respectively; and a second insulating layer disposed on a side of the inorganic layer away from the base substrate, the second insulating layer being located in the first region and the second region.

In some embodiments, the wiring layer includes a plurality of first wires disposed in the first region, a plurality of second wires disposed in the second region, and a plurality of third wires disposed in the side region; and each of the third wires is electrically connected to a third electrode of the plurality of third electrodes and a fourth electrode of the plurality of fourth electrodes.

In some embodiments, a size of the first electrode in an extending direction of the first electrode is in a range of 50 μm to 100 μm.

In some embodiments, a size of the third electrode in an extending direction of the third electrode is in a range of 30 μm to 50 μm, and a size of the fourth electrode in an extending direction of the fourth electrode is in a range of 30 μm to 50 μm.

In some embodiments, a distance between a boundary line of the first region and the first corner region and the selected side surface is in a range of 15 μm to 25 μm; and/or a distance between a boundary line of the second region and the second corner region and the selected side surface is in a range of 15 μm to 25 μm.

In some embodiments, the driving substrate further includes a protective layer located in the bending region, a portion of the first region proximate to the bending region, and a portion of the second region proximate to the bending region, the protective layer covering the connection lead layer, the wiring layer and the electrode layer.

In some embodiments, the driving substrate further includes a plurality of bonding electrodes disposed on the side of the flexible film away from the base substrate, the plurality of bonding electrodes being electrically connected to the plurality of second electrodes.

In some embodiments, a size of each bonding electrode is less than a size of each second electrode.

In some embodiments, a distance between two adjacent bonding electrodes is less than a distance between two adjacent second electrodes.

In another aspect, a light-emitting apparatus is provided, including the driving substrate as described in any one of the embodiments of the above aspect; a plurality of light-emitting devices located on the first surface, the plurality of light-emitting devices being electrically connected to the plurality of first electrodes; and a driver circuit board located on the second surface, the driver circuit board being electrically connected to the plurality of second electrodes.

In yet another aspect, a method for manufacturing a light-emitting apparatus is provided. The method includes: providing an initial base substrate, wherein the initial base substrate includes an initial first surface and an initial second surface that are opposite to each other, and the initial base substrate includes a reserved region and a to-be-removed region; forming a flexible film on the initial first surface of the initial base substrate, wherein the flexible film includes a first region, a second region, and a bending region between the first region and the second region; and the bending region includes a first corner region, a second corner region, and a side region located between the first corner region and the second corner region; forming a wiring layer on a side of the flexible film away from the initial base substrate, the wiring layer being located in the first region, the second region and the side region; forming an electrode layer on a side of the wiring layer away from the initial base substrate, wherein the electrode layer includes a plurality of first electrodes located in the first region, a plurality of second electrodes located in the second region, a plurality of third electrodes located in the side region and proximate to the first corner region, and a plurality of fourth electrodes located in the side region and proximate to the second corner region; each third electrode is electrically connected to a fourth electrode through the wiring layer;

stripping off the bending region and the second region of the flexible film and removing a portion of the initial base substrate in the to-be-removed region to form a base substrate, wherein the base substrate includes a first surface and a second surface that are opposite to each other and a plurality of side surfaces connecting the first surface and the second surface, at least one side surface of the plurality of side surfaces being a selected side surface; bending the flexible film so that portions of the flexible film located in the bending region and the second region are respectively attached to the selected side surface and the second surface of the base substrate; and forming a connection lead layer on the side of the flexible film away from the base substrate, wherein the connection lead layer includes a plurality of first connection leads and a plurality of second connection leads; two ends of each of the first connection leads respectively extend to the first region and the side region, and two ends of each of the second connection leads respectively extend to the second region and the side region; each of the first connection leads is electrically connected to a first electrode of the plurality of first electrodes and a third electrode of the plurality of third electrodes; and each of the second connection leads is electrically connected to a second electrode of the plurality of second electrodes and a fourth electrode of the plurality of fourth electrodes.

In some embodiments, after forming the flexible film on the first surface of the initial base substrate and before forming the wiring layer on the side of the flexible film away from the initial base substrate, the method includes: forming a buffer layer on the side of the flexible film away from the initial base substrate, the buffer layer being located in the first region, the side region and the second region. After forming the wiring layer on the side of the flexible film away from the initial base substrate, the method includes: forming a first insulating layer on the side of the wiring layer away from the flexible film, the first insulating layer being located in the first region, the side region and the second region, the first insulating layer including a plurality of first via holes, a plurality of second via holes, a plurality of third via holes and a plurality of fourth via holes. Forming the electrode layer on the side of the wiring layer away from the initial base substrate, includes: forming the plurality of first electrodes, the plurality of second electrodes, the plurality of third electrodes and the plurality of fourth electrodes on a side of the first insulating layer away from the initial base substrate, so that the first electrode is electrically connected to a portion of the wiring layer located in the first region through a first via hole penetrating the first insulating layer; the second electrode is electrically connected to a portion of the wiring layer located in the second region through a second via hole penetrating the first insulating layer; and the third electrode and the fourth electrode are connected to a portion of the wiring layer located in the side region through a third via hole and a fourth via hole penetrating the first insulating layer, respectively. After forming the electrode layer on the side of the wiring layer away from the initial base substrate, the method further includes: forming an organic layer on a side of the electrode layer away from the initial base substrate, the organic layer being located in the first region and the second region; and forming a second insulating layer on a side of the organic layer away from the initial base substrate, the second insulating layer being located in the first region and the second region.

In some embodiments, forming the connection lead layer on the side of the flexible film away from the base substrate includes: printing a plurality of first connection leads by using a three-dimensional printing process, and printing a plurality of second connection leads printed by using a three-dimensional printing process.

In some embodiments, the method further includes: after forming the connection lead layer, forming a protective layer on the connection lead layer, the wiring layer and the electrode layer.

In some embodiments, the method further includes: providing a plurality of light-emitting devices in the first region of the driving substrate; forming a first adhesive layer on a side of the plurality of light-emitting devices away from the base substrate and forming a second adhesive layer on side walls of the plurality of light-emitting devices; and bonding a driver circuit board to the second region of the driving substrate.

BRIEF DESCRIPTION OF THE DRAWINGS

In order to describe technical solutions in the present disclosure more clearly, the accompanying drawings to be used in some embodiments of the present disclosure will be introduced briefly. However, the accompanying drawings to be described below are merely drawings of some embodiments of the present disclosure, and a person of ordinary skill in the art can obtain other drawings according to those drawings. In addition, the accompanying drawings in the following description may be regarded as schematic diagrams, but are not limitations on actual sizes of products, actual processes of methods and actual timings of signals involved in the embodiments of the present disclosure.

DETAILED DESCRIPTION

Figure 1:
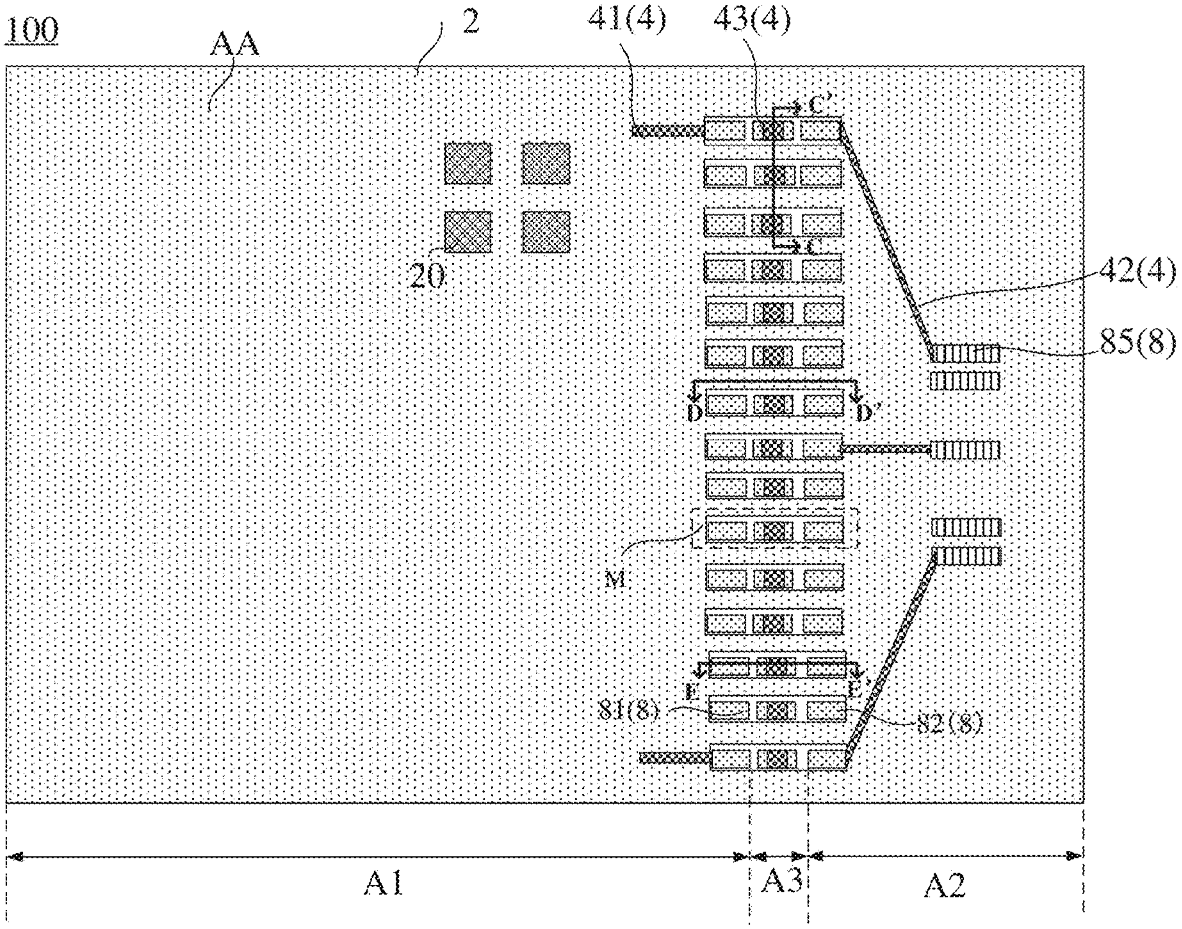
FIG. 1 is a plan view showing a structure of a driving substrate, in accordance with some embodiments of the present disclosure.

The technical solutions in embodiments of the present disclosure will be described clearly and completely with reference to the accompanying drawings. However, the described embodiments are merely some but not all of embodiments of the present disclosure. All other embodiments obtained on the basis of the embodiments of the present disclosure by a person of ordinary skill in the art shall be included in the protection scope of the present disclosure.

Unless the context requires otherwise, throughout the description and claims, the term “comprise” and other forms thereof such as the third-person singular form “comprises” and the present participle form “comprising” are construed as an open and inclusive meaning, i.e., “included, but not limited to”. In the description of the specification, terms such as “one embodiment”, “some embodiments”, “exemplary embodiments”, “example”, “specific example” or “some examples” are intended to indicate that specific features, structures, materials or characteristics related to the embodiment(s) or example(s) are included in at least one embodiment or example of the present disclosure. Schematic representations of the above terms do not necessarily refer to the same embodiment(s) or example(s). In addition, specific features, structures, materials, or characteristics described herein may be included in any one or more embodiments or examples in any suitable manner.

Hereinafter, the terms such as “first” and “second” are used for descriptive purposes only, but are not to be construed as indicating or implying the relative importance or implicitly indicating the number of indicated technical features. Thus, the features defined with “first” and “second” may explicitly or implicitly include one or more of the features. In the description of the embodiments of the present disclosure, the terms “a plurality of” “the plurality of” and “multiple” each mean two or more unless otherwise specified.

Some embodiments may be described using the terms “coupled” and “connected” and derivatives thereof. The term “connected” should be understood in a broad sense. For example, the term “connected” may be a fixed connection, a detachable connection, or an integral connection; alternatively, the term “connected” may be a direct connection or an indirect connection through an intermediate medium. The term “coupled”, for example, indicates that two or more components are in direct physical or electrical contact. However, the term “coupled” or “communicatively coupled” may also indicate that two or more components are not in direct contact with each other, but still cooperate or interact with each other. The embodiments disclosed herein are not necessarily limited to the context herein.

The phrase “at least one of A, B and C” has the same meaning as the phrase “at least one of A, B or C”, both including following combinations of A, B and C: only A, only B, only C, a combination of A and B, a combination of A and C, a combination of B and C, and a combination of A, B and C.

The phrase "A and/or B" includes following three combinations: only A, only B, and a combination of A and B.

The phrase "applicable to" or "configured to" used herein means an open and inclusive expression, which does not exclude devices that are applicable to or configured to perform additional tasks or steps.

The term such as "about", "substantially" or "approximately" as used herein includes a stated value and an average value within an acceptable range of deviation of a particular value determined by a person of ordinary skilled in the art, considering measurement in question and errors associated with measurement of a particular quantity (i.e., limitations of a measurement system).

The term such as "parallel", "perpendicular" or "equal" as used herein includes a stated case and a case similar to the stated case within an acceptable range of deviation determined by a person of ordinary skill in the art, considering measurement in question and errors associated with measurement of a particular quantity (i.e., limitations of a measurement system). For example, the term "parallel" includes absolute parallelism and approximate parallelism, and an acceptable range of deviation of the approximate parallelism may be, for example, a deviation within 5°; the term "perpendicular" includes absolute perpendicularity and approximate perpendicularity, and an acceptable range of deviation of the approximate perpendicularity may also be, for example, a deviation within 5°; and the term "equal" includes absolute equality and approximate equality, and an acceptable range of deviation of the approximate equality may be, for example, that a difference between two equals is less than or equal to 5% of either of the two equals.

It will be understood that, when a layer or element is referred to as being on another layer or substrate, it may be that the layer or element is directly on the another layer or substrate, or it may be that intervening layer(s) exist between the layer or element and the another layer or substrate.

Exemplary embodiments are described herein with reference to sectional views and/or plan views as idealized exemplary drawings. In the accompanying drawings, thicknesses of layers and sizes of regions are enlarged for clarity. Variations in shape relative to the accompanying drawings due to, for example, manufacturing technologies and/or tolerances may be envisaged. Therefore, the exemplary embodiments should not be construed as being limited to the shapes of the regions shown herein, but including deviations due to, for example, manufacturing. For example, an etched region shown as a rectangle shape generally has a feature of being curved. Therefore, the regions shown in the accompanying drawings are schematic in nature, and their shapes are not intended to show actual shapes of regions in a device, and are not intended to limit the scope of the exemplary embodiments.

At present, narrow bezel is a development trend of the display panels. By arranging the bonding terminals in the display panel to be connected to the circuit board on the back surface of the display panel, it may be possible to increase the effective area of the display region, and in turn achieve narrower bezel. The inventors have found that, in some implementations, the wires and bonding terminals in the display region of the display panel are respectively located on opposite sides of the base substrate of the display panel, and the wires and bonding terminals are electrically connected through side wiring. However, the side wiring manner requires chamfering on the arrises of the base substrate (made of silicon oxide or quartz) to reduce the stress and make the leads on the side surface less likely to break. The material of the base substrate is brittle, so that the chamfering process is difficult, the chamfer size is difficult to control, and edge chipping is prone to occur. In some other implementations, a polyimide (PI) layer may be provided on the base substrate. On the same surface of the PI layer, front-surface bonding terminals, back-surface bonding terminals, and connection leads connecting the front-surface bonding terminals and back-surface bonding terminals are first formed, and then the PI layer is bent so that the back-surface bonding terminals are bent to the back surface of the base substrate. However, during the bending process of the PI layer, in order to ensure the flatness of the display panel, the PI needs to fully fit the surfaces and arrises of the base substrate as much as possible. That is, the PI layer has a 90-degree bending region, which mainly includes connection leads. Therefore, the local stress of the connection leads will be increased, which results in breakage and reduces the reliability of the display panel.

In light of this, some embodiments of the present disclosure provide a driving substrate, a light-emitting apparatus, and a method for manufacturing a light-emitting apparatus, to achieve the thinning and narrow bezels of display products, and in turn to ensure or even improve the reliability of display products.

The driving substrate, the light-emitting apparatus and the method for manufacturing the light-emitting apparatus provided in the present disclosure will be introduced below.

Figure 2:
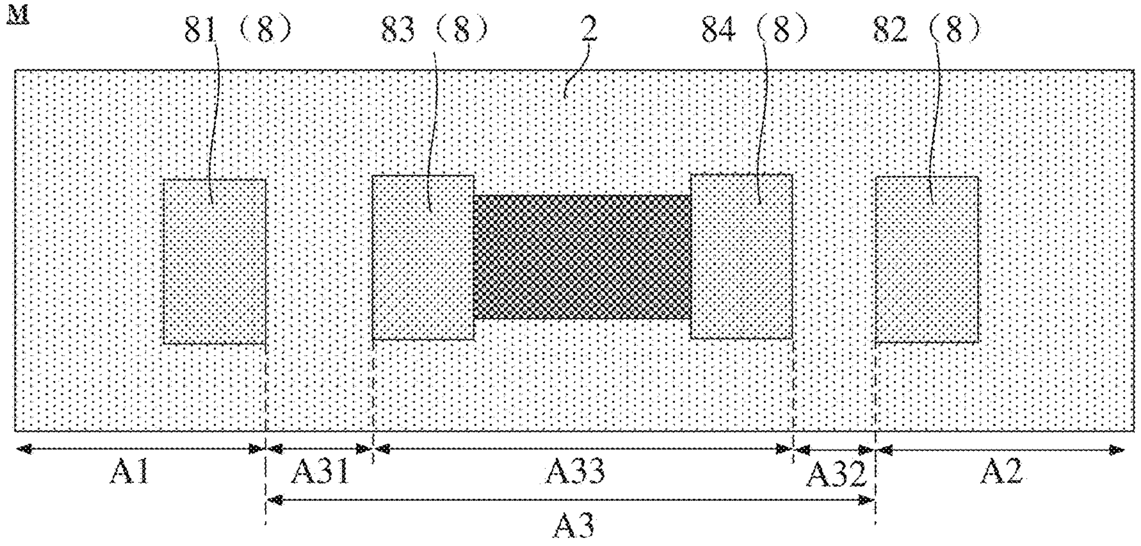
FIG. 2 is a partial enlarged view of the region M in FIG. 1.
Figure 3:
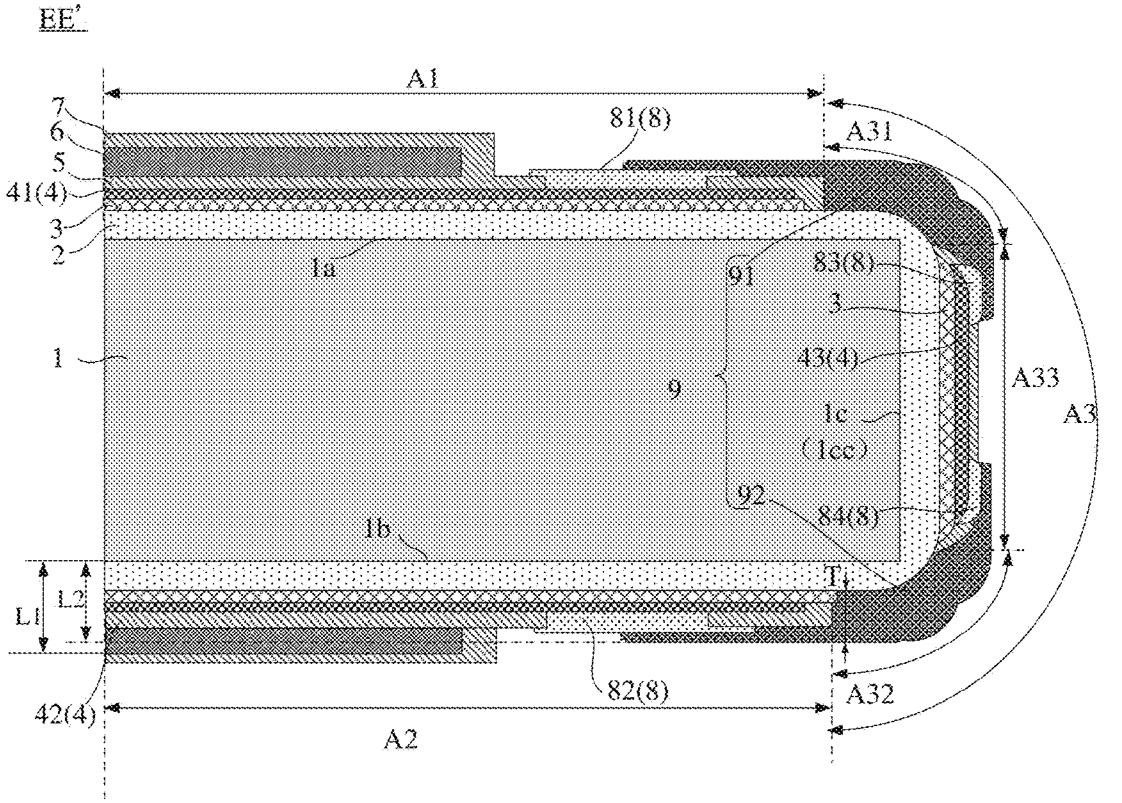
FIG. 3 is a sectional structural view of a driving substrate in a bending state taken along the section line EE' in FIG. 1, in accordance with some embodiments of the present disclosure.
Figure 4:
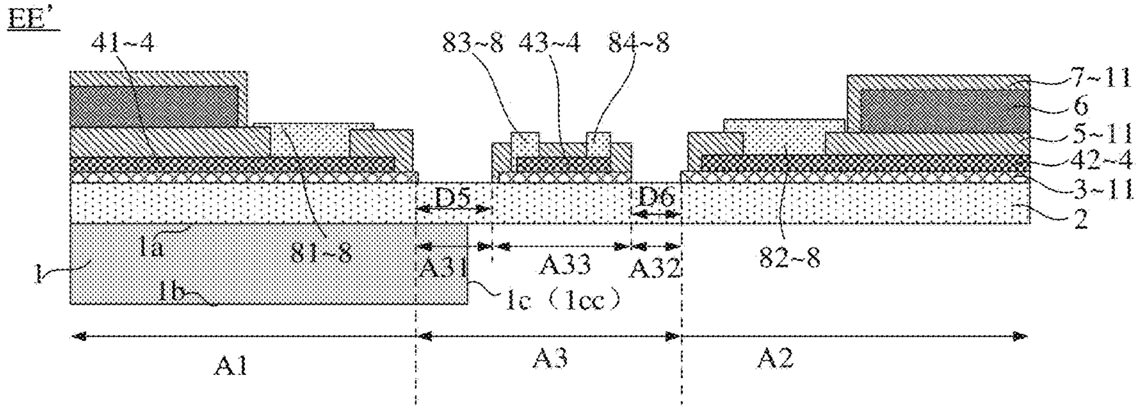
FIG. 4 is a sectional structural view of a driving substrate in a non-bending state taken along the section line EE' in FIG. 1, in accordance with some embodiments of the present disclosure.

FIG. 1 is a plan view illustrating a flexible film in a driving substrate in a non-bending state according to the embodiments of the present disclosure. FIG. 2 is an enlarged view of the region M in FIG. 1. There are three section lines CC', DD' and EE' in FIG. 1. In order to clearly illustrate the position of each film layer in the driving substrate, FIGS. 3 to 10L are sectional views of the driving substrate taken along the three section lines CC', DD' and EE' in different steps, and the upper left corner of each figure will clearly indicate which section line corresponds to the sectional structure. FIG. 3 is a sectional view of the driving substrate in a bending state taken along the section line EE' in FIG. 1. FIG. 4 is a sectional view of the driving substrate before bending taken along the section line EE' in FIG. 1.

Some embodiments of the present disclosure provide a driving substrate 100. As shown in FIG. 3, the driving substrate 100 includes a base substrate 1, a flexible film 2, a wiring layer 4, an electrode layer 8 and a connection lead layer 9 that are stacked in sequence. It should be noted that the sequence of forming the film layers sequentially stacked on the base substrate is consistent with the stacking sequence.

The base substrate 1 includes a first surface 1*a* and a second surface 1*b* that are opposite to each other and a plurality of side surfaces 1*c*, and at least one of the plurality of side surfaces 1*c* is a selected side surface 1*cc*.

For example, the base substrate 1 has a supporting and protective function, and may be made of a rigid material, which may be any one of quartz, glass, silicon dioxide, silicon, plastic, and polymethyl methacrylate, which is not limited here.

The flexible film 2 is disposed on the first surface 1*a*, the selected side surface 1*cc* and a portion of the second surface 1*b* proximate to the selected side surface 1*cc*. The flexible film 2 includes a first region A1 located on the first surface 1*a*, a second region A2 located on the second surface 1*b*, and a bending region A3 located between the first region A1 and the second region A2. The bending region A3 includes a first corner region A31, a second corner region A32 and a side region A33 connecting the first corner region A31 and the second region A32. For example, the flexible film 2 is made of a flexible material with high bending performance. For example, the flexible film 2 is made of polyimide (PI).

It should be noted that the first region A1 is configured to provide light-emitting devices, control circuits and other devices. The second region A2 is configured to provide electrodes and connection lines for bonding a driver circuit board. The driver circuit board includes at least one of a flexible circuit board, a printed circuit board, a programmable logic array circuit board, or an integrated circuit. The bending region A3 is located between the first region A1 and the second region A2, and the flexible film 2 can be bent in the bending region A3, so that the second region A2 of the flexible film 2 is bent to the second surface 1*b* of the base substrate 1. The bending region A3 includes the first corner region A31, the second corner region A32 and the side region A33. The side region A33 is located on the selected side surface 1*cc*, the first corner region A31 is located at a connection position of the first surface 1*a* and the selected side surface 1*cc*, and the second corner region is located at a connection position of the second surface 1*b* and the selected side surface 1*cc*.

The wiring layer 4, the electrode layer 8 and the connection lead layer 9 are arranged on a side of the flexible film 2 away from the base substrate 1. The wiring layer 4 is located in the first region A1, the second region A2 and the side region A33. In some embodiments, as shown in FIG. 3, the wiring layer 4 includes a plurality of first wires 41 disposed in the first region A1, a plurality of second wires 42 disposed in the second region A2, and a plurality of third wires 43 disposed in the side region A33.

The electrode layer 8 includes a plurality of first electrodes 81 located in the first region A1, a plurality of second electrodes 82 located in the second region A2, a plurality of third electrodes 83 located in the side region A33 and proximate to the first corner region A31, and a plurality of fourth electrodes 84 located in the side region A33 and proximate to the second corner region A32. Each third electrode 83 is electrically connected to a fourth electrode 84 through the wiring layer 4. Each third wire 43 is electrically connected to a third electrode 83 of the plurality of third electrodes 83 and a fourth electrode 84 of the plurality of fourth electrodes 84. That is, referring to FIG. 2, the third electrode and the fourth electrode 84 corresponding to each other are connected via the third wire 43. Referring to FIG. 3, each first electrode is electrically connected to a first wire 41, and each second electrode is electrically connected to a second wire 42.

The connection lead layer 9 includes a plurality of first connection leads 91 and a plurality of second connection leads 92. The plurality of first connection leads 91 are located in the first corner region A31, and two ends of each first connection lead 91 extend to the first region A1 and the side region A33, respectively. Each first connection lead 91 connects a first electrode 81 and a third electrode 83. The plurality of second connection leads 92 are located in the second corner region A32, and two ends of each second connection lead 92 extend to the second region A2 and the side region A33, respectively. Each second connection lead 92 connects a second electrode 82 and a fourth electrode 84.

According to the above connection relationships, it can be seen that, as shown in FIG. 3, the corresponding first wire 41, first electrode 81, first connection lead 91, third electrode 83, third wire 43, fourth electrode 84, second connection lead 92, second electrode 82 and second wire 42 are electrically connected in sequence to realize the signal transmission between the front and back surfaces of the driving substrate.

For example, the wiring layer 4, the electrode layer 8, and the connection lead layer 9 are each made of metal. For example, the wiring layer 4, the electrode layer 8, and the connection lead layer 9 are each made of at least one of copper, molybdenum, titanium, or aluminum. For example, the connection lead layer 9 may be of a stacked structure of titanium/aluminum/titanium. The "electrical connection" between components of each layer mentioned above refers to the contact between two of the components, and the metal material is conductive, thereby achieving electrical connection.

Portions, located in the bending region A3 and the second region A2, of the flexible film 2 and each film layer that is stacked on the flexible film 2 can be bent to the selected side surface 1*cc* and the second surface 1*b* of the base substrate 1. As shown in FIG. 3, the portion of the flexible film 2 located in the bending region A3 is attached to an edge of the first surface 1*a* of the base substrate 1 proximate to the selected side surface 1*cc*, the entire selected side surface 1*cc*, and part of an edge of the second surface 1 *b*; and the portion of the flexible film 2 located in the second region A2 is attached to the second surface 1 *b* of the base substrate 1.

The manufacturing process of the driving substrate 100 is described briefly below. After the flexible film 2, the wiring layer 4 and the electrode layer 8 are formed in sequence, the flexible film 2 is first bent, so that the second region of the flexible film, the second wires, and the second electrodes are located on the second surface of the base substrate, and the side region of the flexible film, the third electrodes, the third wires and the fourth electrodes are located on the selected side surface of the base substrate; a part of the first corner region A31 of the bent flexible film is in contact with both the selected side surface 1*cc* and the first surface 1*a* of the base substrate 1; a part of the second corner region A32 of the bent flexible film is in contact with both the selected side surface 1*cc* and the second surface 1*b* of the base substrate 1; and then, the connection lead layer 9 is formed on a side of the electrode layer 8 away from the base substrate 1, so that the connection lead layer 9 is electrically connected to the electrode layer 8.

In the above driving substrate 100, after the flexible film 2 is bent, the connection lead layer 9 is formed on the side of the electrode layer 8 away from the base substrate 1. That is, before the flexible film 2 is bent, no connection lead is provided in the first corner region A31 and the second corner region A32, and the connection lead layer 9 is formed after bending. Therefore, it can avoid the problem that in the related art, during the bending process of the flexible film 2, the stress on the connection leads on the surface of the flexible film 2 (especially the regions that need to be bent: the first corner region A31 and the second corner region A32) increases to cause breakage, and in turn ensure the connection stability of the plurality of first connection leads 91 and the plurality of second connection leads 92 connected to the electrode layer 8, and enhance the reliability of the driving substrate 100.

In some embodiments, the connection leads connecting the front and back surfaces of the base substrate are formed using a printing process, which usually requires three processes to respectively print a part of the connection leads located on the front surface of the base substrate, a part of the connection leads located on the side surface of the base substrate, and a part of the connection leads located on the back surface of the base substrate. Therefore, the printing efficiency is low, and high-precision scanning of all positions on the side surface is required, causing difficulty in process implementation.

In the driving substrate 100 provided in the embodiments of the present disclosure, the part of the wiring layer 4 located in the side region A33 is electrically connected to the third electrodes 83 and the fourth electrodes 84 of the electrode layer 8. That is, the connection between the third electrode 83 and the fourth electrode 84 is realized through the third wire 43. Therefore, in the process of manufacturing the connection lead layer 9, only the first connection leads 91 and the second connection leads 92 need to be formed; and the electrical connection between the first electrode 81 and the third electrode 83 is realized through the first connection lead 91, and the electrical connection between the fourth electrode 84 and the second electrode 82 is realized through the second connection lead 92, thereby realizing the signal transmission between the first electrode 81 and the second electrode 82. Thus, there is no need to form a connection lead layer in the side region A33, the part of the wiring layer 4 located in the side region A33 is equivalent to the connection leads between the third electrodes 83 and the fourth electrodes 84. In this way, the difficulty of forming the connection lead layer can be reduced, the process of forming the connection lead layer 9 is simplified, and the efficiency of manufacturing the driving substrate is improved. For example, when a printing process is used to form the connection lead layer, two processes are respectively used to print the plurality of first connection leads 91 and the plurality of second connection leads 92, so that one process of printing the connection lead layer in the side region is omitted, and the manufacturing efficiency is improved, and the printing firing pin problem in the high-precision forming process of the connection leads is ameliorated.

In some embodiments, as shown in FIG. 3, a thickness T of the connection lead layer 9 is in a range of 2 μm to 5 μm.

For example, the thickness of the connection lead layer 9 is 2 μm, 2.5 μm, or 5 μm. As shown in FIG. 3, the thickness of the connection lead layer 9 is not the same everywhere; forming the connection lead layer 9 includes, for example, forming the first connection leads 91 and the second connection leads 92 by three-dimensional printing process after the flexible film 2 is bent; and two ends of the first connection lead 91 extend to the first region A1 and the side region A33 respectively, and two ends of the second connection lead 92 extend to the second region A2 and the side region A33 respectively; and a portion of the first connection lead 91 located in the first corner region A31 and a portion of the second connection lead 92 located in the second corner region A32 each have a large thickness, for example, the thickness T is 5 μm.

In some embodiments, widths of the plurality of first connection leads 91 are approximately the same, and widths of the plurality of second connection leads 92 are approximately the same.

For example, in the process of forming the connection lead layer 9, the plurality of first connection leads 91 are formed first and then the plurality of second connection leads 92 are formed; alternatively, the plurality of second connection leads 92 are formed first and then the plurality of first connection leads 91 are formed. The order of forming the plurality of first connection leads 91 and the plurality of second connection leads 92 is not limited here. It should be noted that in the plurality of first connection leads 91 or the plurality of second connection leads 92 are formed by a single three-dimensional printing process. Therefore, widths of the plurality of formed first connection leads 91 are approximately equal, and widths of the plurality of formed second connection leads 92 are approximately equal; the plurality of first connection leads 91 and the plurality of second connection leads 92 are evenly distributed, and a larger number of first and second connection leads can be formed under the same size conditions, so that the precision of the wiring is improved; therefore, smaller-sized devices can be adapted to the first surface of the driving substrate, resulting in a display panel with a higher resolution. In the process of forming the connection lead layer 9, only two three-dimensional printing processes are required for printing. Compared with the existing printing manner in which the front, side and back surfaces of the base substrate are respectively subjected to printing processes, one process of printing the leads on the side surface is omitted to improve the printing efficiency.

In some embodiments, as shown in FIGS. 3 and 4, the driving substrate 100 further includes at least one inorganic layer 11 and/or at least one organic layer 6 disposed on the side of the flexible film 2 away from the base substrate 1. The inorganic layer 11 is located in the first region A1, the second region A2 and the side region A33. The organic layer 6 is located in the first region A1 and the second region A2. The connection lead layer 9 is partially in contact with the flexible film 2.

As shown in FIG. 4, when the driving substrate 100 is in a state before bending, the inorganic layer 11 and/or the organic layer 6 are disposed on the side of the flexible film 2 away from the base substrate 1, and both are hollowed out in the first corner region A31 and the second corner region A32. That is to say, portions of the surface of the flexible film 2 in the first corner region A31 and the second corner region A32 is exposed. Therefore, when the connection lead layer 9 is subsequently formed, the connection lead layer 9 is partially in contact with the surface of the flexible film 2. It should be noted that FIG. 4 is only intended to clearly illustrate the position of each film layer in the driving substrate; the driving substrate is in a non-bending state so that the same film layer is located on the same plane; and the structure shown in FIG. 4 does not actually exist in the final display apparatus. In some embodiments provided in the present disclosure, before the connection lead layer 9 and the protective layer 10 are formed, the driving substrate has been bent, which is in the status shown in FIG. 3.

The inorganic layer and the organic layer in the driving substrate 100 play an insulation or protection role. By removing portions of the inorganic layer and the organic layer in the first corner region A31 and the second corner region A32, it can avoid the breakage of the organic layer/inorganic layer in the first corner region A31 and the second corner region A32 due to stress concentration during the bending process of the flexible film, which causes water and oxygen to enter from the cracks and affects the insulation and protection effects. Moreover, the first corner region A31 and the second corner region A32 are only provided with part of the flexible film; the flexible film has a small thickness, is easier to bend, and can be bent at a minimum angle; the flexible film can fully fit to the surfaces and arrises of the base substrate as much as possible to achieve a bending close to 90 degrees, thereby ensuring the flatness of the film layer of the driving substrate. In addition, after the flexible film is bent, the connection lead layer is formed. The connection lead layer is in contact with the flexible film, and another part thereof overlaps the electrode layer. The bonding force is good, and the reliability of the connection lead layer is improved.

In some embodiments, referring to FIGS. 3 and 4, the driving substrate 100 further includes an organic layer 6, and the organic layer 6 is disposed on a side of the electrode layer 8 away from the base substrate 1.

For example, the organic layer 6 is made of a resin material.

For example, in the first region A1 and the second region A2, the organic layer 6 is disposed on the side of the electrode layer 8 away from the base substrate 1. In a case where the connection lead layer 9 is not formed, the organic layer 6 exposes surfaces, away from the base substrate 1, of the first electrode 81 electrically connected to the first connection lead 91 and the second electrode 82 electrically connected to the second connection lead 92; and in a case where the connection lead layer 92 is subsequently formed, the connection lead layer 9 can be in contact with the surfaces of the first electrode 81 and the second electrode 82.

It should be noted that, referring to FIG. 3, a distance L1 between a surface of the organic layer 6 away from the base substrate and the base substrate is greater than a distance L2 between a surface of the connection lead layer away from the base substrate and the base substrate. The surface of the connection lead layer 9 is not flush with the surface of the organic layer 6. The organic layer 6 and the connection lead layer 9 have a difference in thickness. In this way, after the connection lead layer 9 is formed, it may play a role in preventing scratches on circuits in the subsequent processes and assembly processes, and improve the reliability of the driving substrate 100.

In some embodiments, referring to FIG. 4, the driving substrate 100 further includes the at least one inorganic layer 11, the at least one inorganic layer 11 includes a buffer layer 3 disposed between the flexible film 2 and the wiring layer 4, and the buffer layer 3 is located in the first region A1, the side region A33 and the second region A2.

Figure 5:
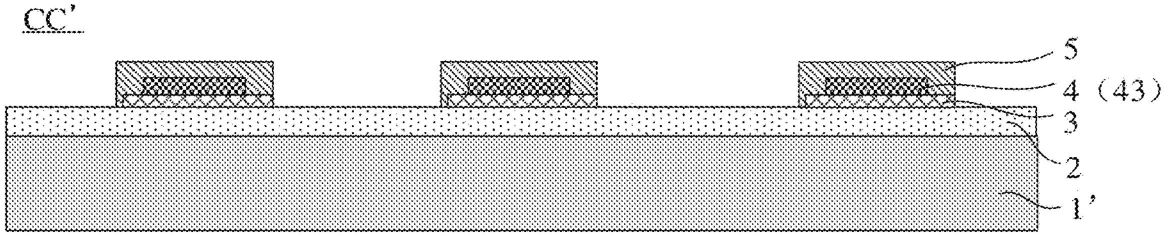
FIG. 5 is a sectional structural view of a driving substrate in a non-bending state taken along the section line CC' in FIG. 1, in accordance with some embodiments of the present disclosure.

For example, the buffer layer 3 is made of silicon nitride, silicon oxide or silicon oxynitride. A thickness of the buffer layer 3 is in a range of 0.2 μm to 0.6 μm. For example, the thickness of the buffer layer 3 is 0.2 μm, 0.4 μm, or 0.6 μm. The buffer layer 3 is configured to block water vapor from entering the interior of the driving substrate 100. Referring to FIG. 5, the buffer layer 3 shown in FIG. 5 has a uniform thickness at different positions, and the buffer layer 3 is arranged correspondingly to the wiring layer 4. In a direction of the section line CC', two adjacent third wires 43 have a gap therebetween, thus being arranged at intervals as shown in FIG. 5.

With continued reference to FIG. 4, the inorganic layer 11 further includes a first insulating layer 5 disposed between the wiring layer 4 and the electrode layer 8. The first insulating layer 5 is located in the first region A1, the side region A33 and the second region A2. The first electrode 81 is electrically connected to a part of the wiring layer 4 located in the first region A1 (the first wire 41) through a first via hole penetrating the first insulating layer 5. The second electrode 82 is electrically connected to a portion (the second wire 42) of the wiring layer 4 located in the second region A2 through a second via hole 52 penetrating the first insulating layer 5. The third electrode 83 and the fourth electrode 84 are electrically connected to a portion (the third wire 43) of the wiring layer 4 located in the side region A33 through a third via hole and a fourth via hole penetrating the first insulating layer 5, respectively.

For example, the first insulating layer 5 is made of silicon nitride, silicon oxide or silicon oxynitride. The first insulating layer 5 has the same pattern as the wiring layer 4 and covers the wiring layer 4, thereby protecting the wiring layer 4 and preventing water and oxygen from corroding the metal of the wiring layer 4.

The inorganic layer 11 further includes a second insulating layer 7 disposed on a side of the organic layer 6 away from the base substrate 1, and the second insulating layer 7 is located in the first region A1 and the second region A2. For example, the second insulating layer 7 is made of silicon nitride, silicon oxide or silicon oxynitride. The second insulating layer has the same pattern as the organic layer 6 and covers the organic layer 6, thereby protecting the organic layer 6 and preventing water and oxygen from corroding the organic layer 6.

Figure 6:
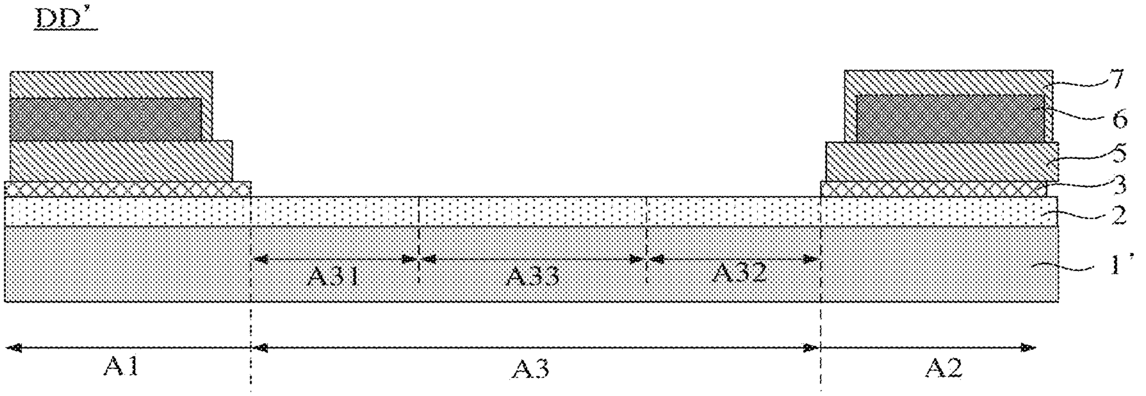
FIG. 6 is a sectional structural view of a driving substrate in a non-bending state taken along the section line DD' in FIG. 1, in accordance with some embodiments of the present disclosure.

Since the buffer layer 3, the first insulating layer 5 and the second insulating layer 7 are each made of an inorganic material with poor bending performance and are prone to be broken during the bending process, portions of the initially formed buffer layer 3, first insulating layer 5 and second insulating layer 7 located in the first corner region A31 and the second corner region A32 are completely removed. As shown in FIG. 6, the first corner region A31 and the second corner region A32 include only part of the flexible film 2; therefore, in the subsequent bending process, the bending of the flexible film 2 is easy, and problems such as breakage of the inorganic layer will not occur.

In some embodiments, as shown in FIG. 3, the wiring layer 4 includes a plurality of first wires 41 disposed in the first region A1, a plurality of second wires 42 disposed in the second region A2, and a plurality of third wires 43 disposed in the side region A33; and each third wire 43 is electrically connected to a third electrode 83 of the plurality of third electrodes 83 and a fourth electrode 84 of the plurality of fourth electrodes 84.

For example, the first insulating layer 5 includes a plurality of first via holes, a plurality of second via holes, a plurality of third via holes, and a plurality of fourth via holes. The first electrode 81 is electrically connected to the first wire 41 of the wiring layer 4 located in the first region A1 through the first via hole penetrating the first insulating layer 5. The second electrode 82 is electrically connected to the second wire 42 of the wiring layer 4 located in the second region A2 through the second via hole penetrating the first insulating layer 5. The third electrode 83 and the fourth electrode 84 are electrically connected to the third wire 43 of the wiring layer 4 located in the side region A33 through the third via hole and the fourth via hole penetrating the first insulating layer 5, respectively.

Figure 7:
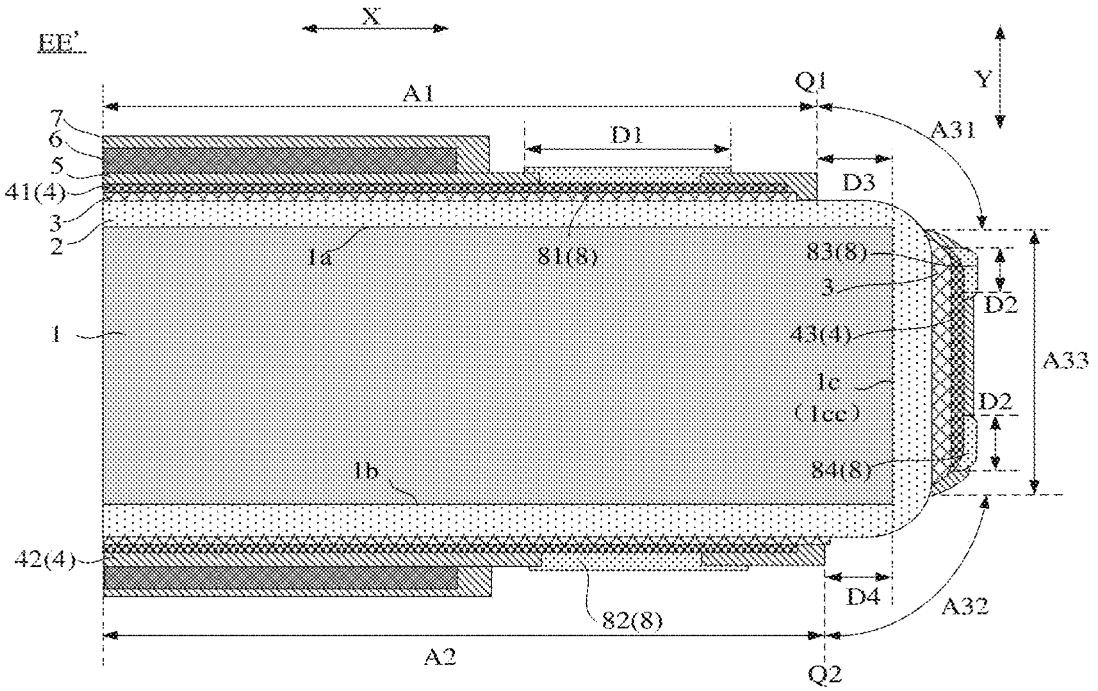
FIG. 7 is a sectional structural view of a driving substrate in a bending state taken along the section line EE' in FIG. 1, in accordance with some other embodiments of the present disclosure.

In some embodiments, as shown in FIG. 7, a size D1 of the first electrode 81 in its extending direction is in a range of 50 μm to 100 μm.

For example, referring to FIG. 7 in which the extending direction of the first electrode 81 is taken as a first direction X, the size D1 of the first electrode 81 in the first direction X may be 50 μm, 70 μm, 90 μm, or 100 μm.

In some embodiments, as shown in FIG. 4, a size D2 of the third electrode 83 in an extending direction of the third electrode 83 and a size D2 of the fourth electrode 84 in an extending direction of the fourth electrode 84 are each in a range of 30 μm to 50 μm.

For example, referring to FIG. 7 in which the extending direction of the third electrode 83 and the fourth electrode 84 is taken as a second direction Y, the sizes D2 of the third electrode 83 and the fourth electrode 84 in the second direction Y may each be 30 μm, 40 μm or 50 μm.

Figure 8:
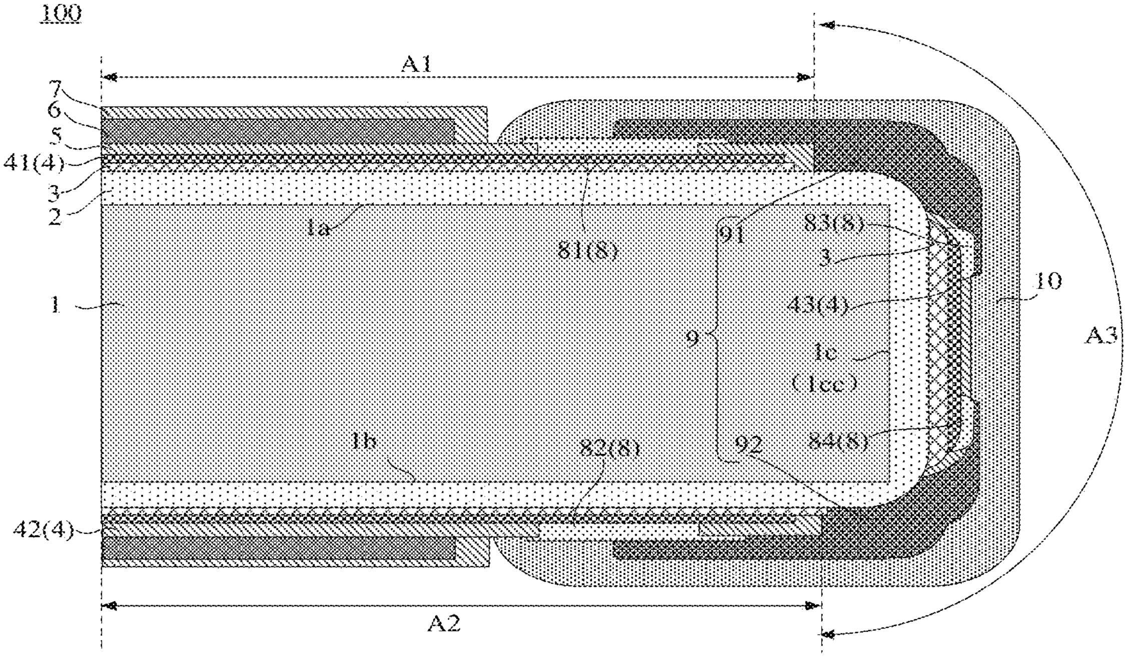
FIG. 8 a sectional structural view of a driving substrate in a bending state taken along the section line EE' in FIG. 1, in accordance with yet some other embodiments of the present disclosure.

In some examples, as shown in FIG. 8, an end of the first connection lead 91 is in contact with a part of an upper surface of the first electrode 81, and another end of the first connection lead is in contact with an entire upper surface of the third electrode 83; an end of the second connection lead 92 is in contact with a part of an upper surface of the second electrode 82, and another end of the second connection lead 92 is in contact with an entire upper surface of the fourth electrode 84; therefore, the sufficient overlap between the connection lead layer and the electrode layer is ensured, the contact resistance is reduced, and the signal transmission performance is improved.

As shown in FIG. 4, when the flexible film 2 is not bent, a size D5 of the first corner region A31 in the first direction X is in a range of 30 μm to 50 μm, and a size D6 of the second corner region A32 in the first direction X is in a range of 30 μm to 50 μm.

In some embodiments, as shown in FIG. 7, a distance D3 between a boundary line Q1 of the first region A1 and the first corner region A31 and the selected side surface 1*cc* is in a range of 15 μm to 25 μm.

It can be understood that since a part of the first corner region A31 extends in the first direction X and another part of the first corner region A31 extends in the second direction Y, the distance D3 between the boundary line Q1 of the first region A1 and the first corner region A31 and the selected side surface 1*cc* is the size of the first corner region A31 in the first direction X. The distance D3 between the boundary line Q1 of the first region A1 and the first corner region A31 and the selected side surface 1*cc* may be 15 μm, 20 μm or 25 μm.

In some embodiments, as shown in FIG. 7, a distance D4 between a boundary line Q2 of the second region A2 and the second corner region A32 and the selected side surface 1*cc* is in a range of 15 μm to 25 μm.

With reference to the above description of D3, it can be seen that since a part of the second corner region A32 extends in the first direction X and another part of the second corner region A32 extends in the second direction Y, the distance D4 between the boundary line Q2 of the second region A2 and the second corner region A32 and the selected side surface 1*cc* is the size of the second corner region A32 in the first direction X. The distance D4 between the boundary line Q2 of the second region A2 and the second corner region A32 and the selected side surface 1*cc* may be 15 μm, 20 μm or 25 μm.

In some embodiments, as shown in FIG. 7, the distance D3 between the boundary line Q1 of the first region A1 and the first corner region A31 and the selected side surface 1*cc* is in a range of 15 μm to 25 μm, and the distance D4 between the boundary line Q2 of the second region A2 and the second corner region A32 and the selected side surface 1*cc* is in a range of 15 μm to 25 μm.

For example, as for details of the distance D3 between the boundary line Q1 of the first region A1 and the first corner region A31 and the selected side surface 1*cc* and the distance D4 between the boundary line Q2 of the second region A2 and the second corner region A32 and the selected side surface 1*cc*, reference can be made to the above description; and the sizes of the first corner region A31 and the second corner region A32 in the second direction Y are not limited here. For example, each of the sizes of the first corner region A31 and the second corner region A32 in the second direction Y is in a range of 15 μm to 25 μm, such as 15 μm, 20 μm or 25 μm.

The above sizes D3 to D6 need to ensure that the first corner region of the flexible film wraps an arris formed by the meeting of the first surface and the selected side surface of the base substrate, and ensure that the second corner region of the flexible film wraps an arris formed by the meeting of the second surface and the selected side surface of the base substrate. The above sizes D3 to D6 are also related to the cutting accuracy of the base substrate. During the manufacturing process of the driving substrate, the flexible film is laid entirely on the initial base substrate, and the initial base substrate provides support to facilitate the fabrication of metal layer(s), organic layer(s) and inorganic layer(s) on the flexible film. Before the flexible film is bent, a part of the initial base substrate needs to be cut off so that the bending region and the second region of the flexible film are suspended. For example, the cutting accuracy of the base substrate is +15 μm, and the above sizes D3 to D6 are compatible with the cutting accuracy of +15 μm.

In some embodiments, as shown in FIG. 8, the driving substrate 100 further includes a protective layer 10 located in the bending region A3, a portion of the first region A1 proximate to the bending region A3, and a portion of the second region A2 proximate to the bending region A3. The protective layer 10 covers the connection lead layer 9, the wiring layer 4 and the electrode layer 8.

For example, the protective layer 10 is made of an inorganic material, such as silicon nitride or silicon oxide. As shown in FIG. 5, the protective layer 10 covers the connection lead layer 9, the wiring layer 4 and the electrode layer 8, and has a certain insulation effect, thus protecting the plurality of first connection leads 91 as well as the wiring layer 4 and the electrode layer 8, blocking water and oxygen, protecting the wiring layer 4 and the electrode layer 8 from water and oxygen corrosion, and prolonging the service life.

Figure 9:
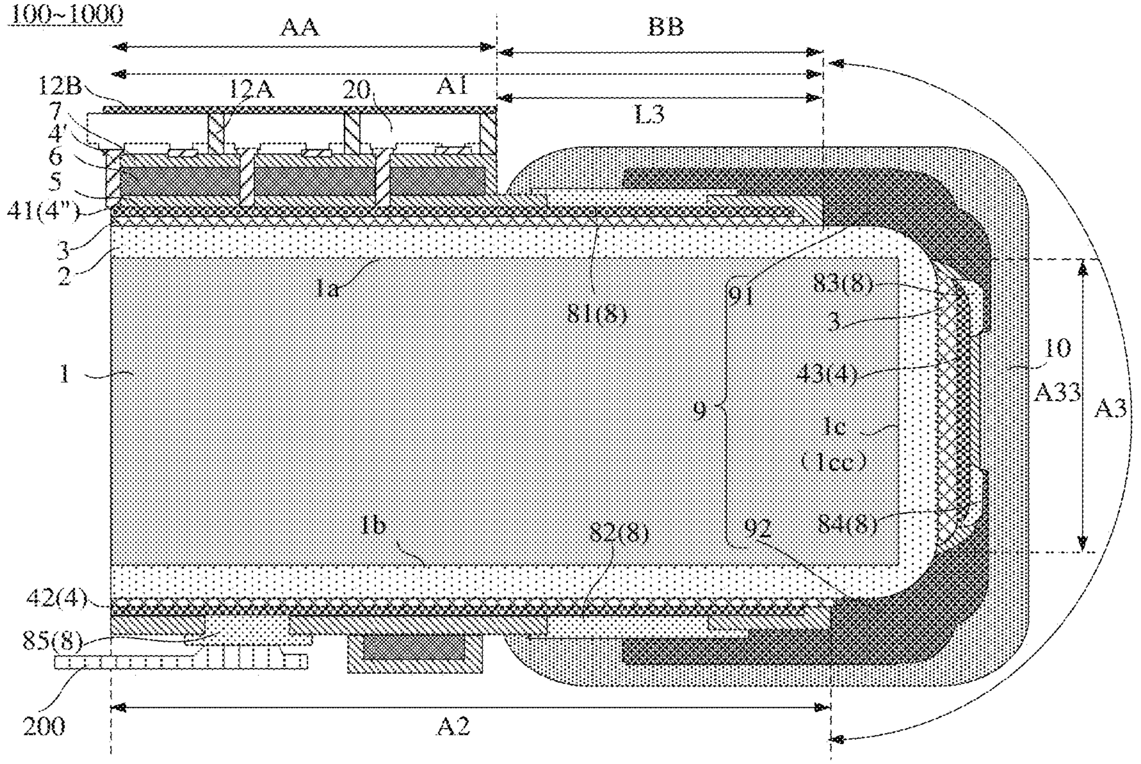
FIG. 9 is a structural diagram of a light-emitting apparatus, in accordance with some embodiments of the present disclosure.

As shown in FIG. 9, some embodiments of the disclosure further provide a light-emitting apparatus 1000 including the driving substrate 100 provided in any one of the above embodiments. The light-emitting apparatus 1000 includes the driving substrate 100, a plurality of light-emitting devices 20, and a driver circuit board 200.

The plurality of light-emitting devices 20 are located on the first surface 1*a*, and the plurality of light-emitting devices 20 are electrically connected to the plurality of first electrodes 81. The driver circuit board 200 is located on the second surface 1*b*, and the driver circuit board 200 is electrically connected to the plurality of second electrodes 82. For example, the driver circuit board 200 may be directly electrically connected to the plurality of second electrodes 82 to be bonded to the driving substrate 100. Alternatively, as shown in FIG. 9, the driver circuit board 200 is electrically connected to the plurality of second electrodes 82 through a plurality of bonding electrodes 85 and a plurality of second wires 42.

As shown in FIG. 1, the driving substrate 100 further includes a plurality of bonding electrodes 85 disposed on the side of the flexible film 2 away from the base substrate 1. The plurality of bonding electrodes 85 are electrically connected to the plurality of second electrodes 82, and the plurality of bonding electrodes 85 and the plurality of second electrodes 82 are located in the electrode layer 8. The plurality of bonding electrodes 85 occupy a smaller area relative to the plurality of second electrodes 82. A size of each bonding electrode in the plurality of bonding electrodes 85 is less than a size of each second electrode in the plurality of second electrodes 82; and/or a distance between two adjacent bonding electrodes 85 in the plurality of bonding electrodes 85 is less than a distance between two adjacent second electrodes 82 in the plurality of second electrodes 82; therefore, the display panel may be adapted and connected to the driver circuit board 200 that is highly integrated and smaller in size. As a result, the volume of the display apparatus is further reduced. It can be understood that the driver circuit board 200 has gold fingers, and each gold finger is firmly electrically connected to a corresponding bonding electrode 85 or second electrode 82 through conductive adhesive or other materials.

In some examples, the plurality of light-emitting devices 20 and the wiring layer 4 have a connection relationship that: a part of the wiring layer 4 located in the first region A1 includes a first wiring layer 4" and a second wiring layer 4', the second wiring layer 4' is electrically connected to the first wiring layer 4" through opening(s) penetrating the second insulating layer 7, the organic layer 6 and the first insulating layer 5, and the light-emitting devices 20 are in direct contact with and electrically connected to the second wiring layer 4'. In some other examples, the part of the wiring layer 4 located in the first region A1 may include only a single-layer structure.

In some embodiments, as shown in FIG. 9, the light-emitting apparatus 1000 further includes: a first adhesive layer 12B disposed on a side of the light-emitting devices 20 away from the base substrate 1, and a first adhesive layer 12A disposed between adjacent light-emitting devices 20. The first adhesive layer 12B may be of a color of black, gray, etc., and is used to protect the light-emitting devices 20 and improve the display contrast of the light-emitting devices 20 in scenarios with strong ambient light. However, it can be understood that the thickness of the first adhesive layer 12B should not be too large and is standardized to ensure that the light-emitting devices 20 emit normal display brightness. The second adhesive layer 12A may be of a color of black, gray, green, or brown, and is used to avoid the interference of light emitted by the light-emitting devices 20, thereby improving the display effect of the display screen. In some embodiments, the first adhesive layer 12B and the second adhesive layer 12A may be made of the same material, and the first adhesive layer 12B and the second adhesive layer 12A may be disposed on the side of the light emitting devices 20 away from the base substrate 1 by an attaching and rolling manner.

As shown in FIG. 9, the first region A1 of the driving substrate 100 includes a display region AA and a peripheral region BB located on at least one side of the display region AA. For example, the peripheral region BB is close to the bending region A3 at least. In some embodiments, in a direction perpendicular to the side surface 1*c* of the base substrate 1, a size L3 of the peripheral region BB is less than 30 μm; and from the foregoing description, it can be known that when the driving substrate 100 is in a bending state, in the direction perpendicular to the side surface 1*c* of the base substrate 1, a distance between the peripheral region BB and an outermost edge of the driving substrate 100 is in a range of 15 μm to 25 μm, inclusive. Thus, the driving substrate 100 has a narrow bezel and can adapt to the narrow bezel development requirements of the display apparatus.

For example, the light-emitting apparatus 1000 is a display apparatus. For example, the display apparatus may be a Mini LED display apparatus or a Micro LED display apparatus.

In some examples, mini light-emitting diodes or micro light-emitting diodes are used as light-emitting devices, and they occupy a smaller volume and have smaller granularity compared with traditional LEDs. Within the same screen size, the light source density per unit area is higher and the light source unit size per unit area is smaller. Thus, more precise local control of the light-emitting devices can be achieved, the uniformity of the display brightness may be guaranteed, and the display quality of the display device is guaranteed.

The display apparatus may be any apparatus that displays images whether in motion (e.g., videos) or stationary (e.g., still images) and whether text or images. More specifically, it is contemplated that the described embodiments may be implemented in or associated with various electronic devices. The various electronic devices include, for example, but are not limited to, mobile phones, wireless devices, personal digital assistants (PDAs), handheld or portable computers, GPS receivers/navigators, cameras, MP4 video players, video cameras, game consoles, watches, clocks, calculators, television monitors, flat panel displays, computer monitors, car displays (e.g., odometer displays, etc.), navigators, cockpit controllers and/or displays, camera view displays (e.g., rear view camera displays in vehicles), electronic photos, electronic billboards or signages, projectors, architectural structures, packaging and aesthetic structures (e.g., displays for images of a piece of jewelry).

For example, the light-emitting apparatus 1000 may also be used as a direct-lit backlight source in a liquid crystal display apparatus to provide light to the display panel on its light-exit side.

The specific form of the light-emitting apparatus 1000 is not specially limited in the embodiments of the present disclosure. The light-emitting apparatus 1000 adopts the driving substrate 100 provided in the above-mentioned embodiments.

Therefore, the light-emitting apparatus 1000 provided in the present disclosure has all the beneficial effects of the driving substrate 100 provided in any of the above embodiments, and details will not be repeated here.

Some embodiments of the present disclosure further provide a method for manufacturing a light-emitting substrate, which includes as follows.

Figure 10A:
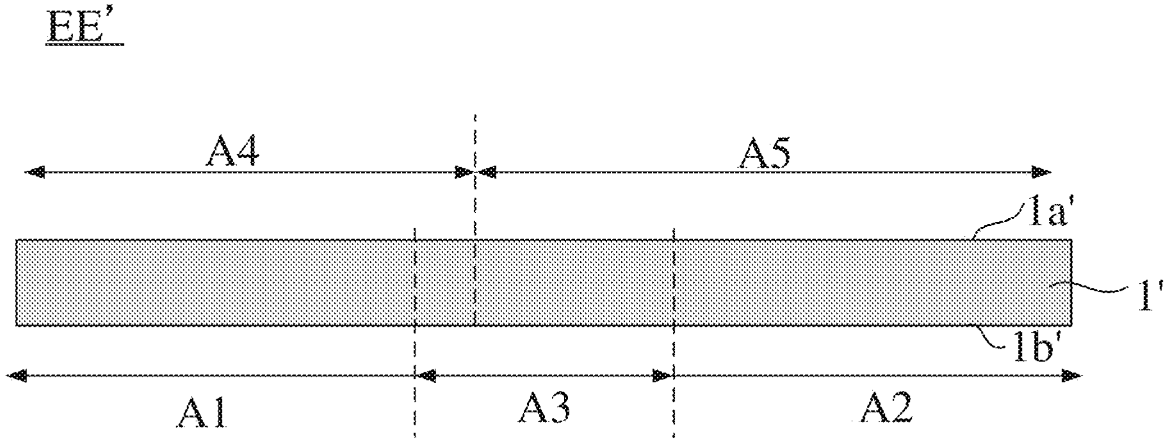
FIG. 10A is a diagram showing a step S1 of a method for manufacturing a light-emitting apparatus, in accordance with some embodiments of the present disclosure.

In S1, as shown in FIG. 10A, an initial base substrate 1' is provided; the initial base substrate 1' includes an initial first surface 1*a'* and an initial second surface 1*b'* that are opposite to each other; and the initial base substrate 1' includes a reserved region A4 and to-be-removed region A5.

For example, the initial base substrate 1' is a glass substrate or a silicon substrate.

Figure 10B:
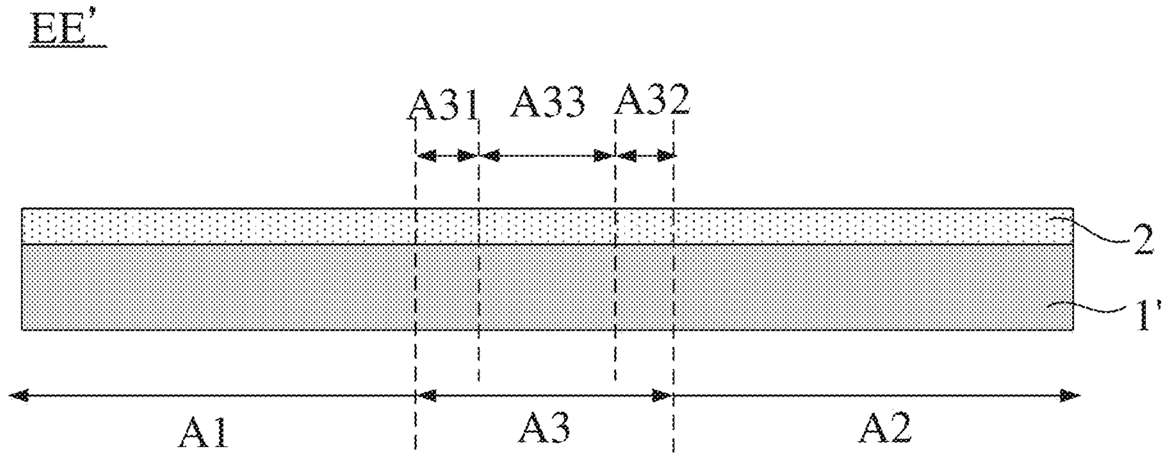
FIG. 10B is a diagram showing a step S2 of a method for manufacturing a light-emitting apparatus, in accordance with some embodiments of the present disclosure.

In S2, as shown in FIG. 10B, a flexible film 2 is formed on the initial first surface 1*a'* of the initial base substrate 1'; the flexible film 2 includes a first region A1, a second region A2, and a bending region A3 located between the first region A1 and the second region A2; the bending region A3 includes a first corner region A31, a second corner region A32, and a side region A33 located between the first corner region A31 and the second corner region A32.

For example, the flexible film 2 is made of polyimide, and the initial first surface 1*a'* of the initial base substrate 1' is coated with the material of the flexible film 2 using a coating process to form the flexible film 2.

Figure 10C:
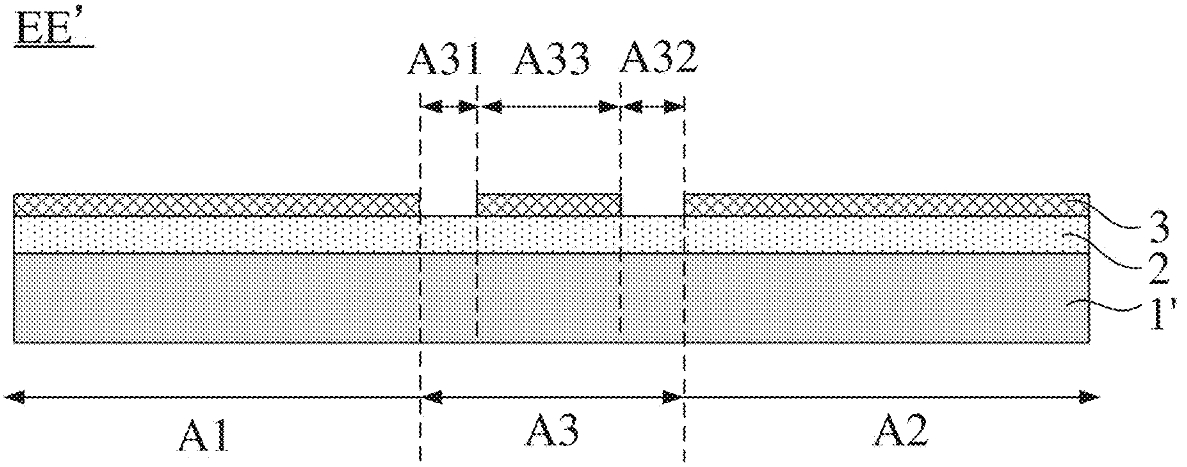
FIG. 10C is a diagram showing a step S3 of a method for manufacturing a light-emitting apparatus, in accordance with some embodiments of the present disclosure.

In S3, as shown in FIG. 10C, a buffer layer 3 is formed on a side of the flexible film 2 away from the initial base substrate 1'. The buffer layer 3 is located in the first region A1, the second region A2 and the side region A33.

For example, the buffer layer 3 is made of silicon nitride, silicon oxide or silicon oxynitride. The above step may be, for example: S31 of forming an initial buffer layer on the side of the flexible film 2 away from the initial base substrate 1'; for example, the material of the buffer layer 3 is deposited using a deposition process, and the initial buffer layer is located in the first region A1, the second region A2 and the bending region A3. In S32, portions of the initial buffer layer located in the first corner region A31 and the second corner region A32 are removed to form the buffer layer 3. For example, the portions of the initial buffer layer located in the first corner region A31 and the second corner region A32 are removed using an etching process.

Figure 10D:
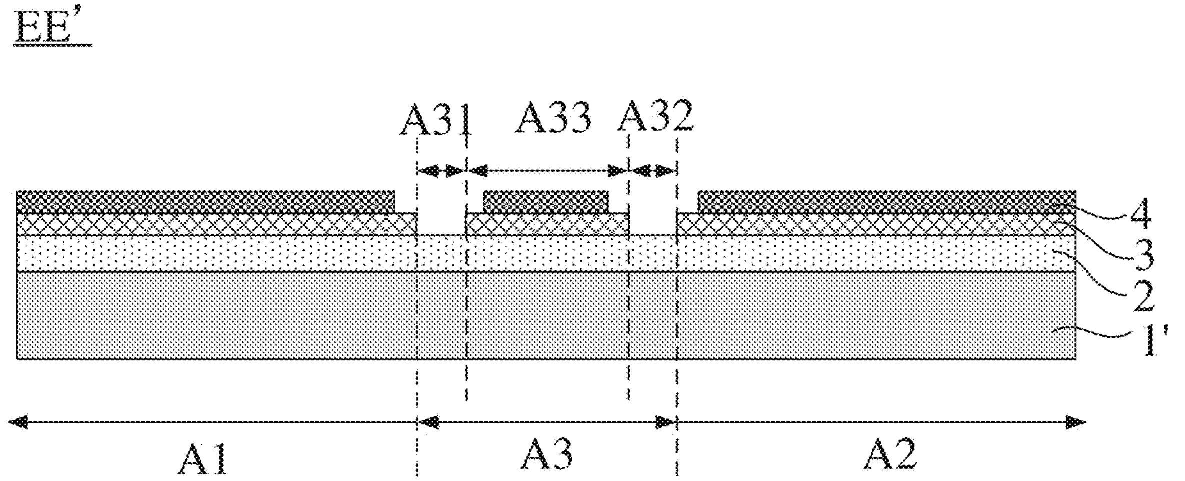
FIG. 10D is a diagram showing a step S4 of a method for manufacturing a light-emitting apparatus, in accordance with some embodiments of the present disclosure.

In S4, as shown in FIG. 10D, a wiring layer 4 is formed on a side of the buffer layer 3 away from the initial base substrate 1'. The wiring layer 4 is located in the first region A1, the second region A2 and the side region A33.

For example, the wiring layer 4 is made of at least one of copper, molybdenum, titanium, or aluminum. The material of the wiring layer 4 is deposited in the first region A1, the second region A2 and the side region A33, and a set pattern is formed through a patterning process. The wiring layer 4 includes a plurality of first wires 41 disposed in the first region A1, a plurality of second wires 42 disposed in the second region A2, and a plurality of third wires 43 disposed in the side region A33.

It should be noted that the patterning process in the embodiments of the present disclosure includes a thin film deposition, photoresist coating, exposure using a mask, development, etching, photoresist removal processes, etc.

Figure 10E:
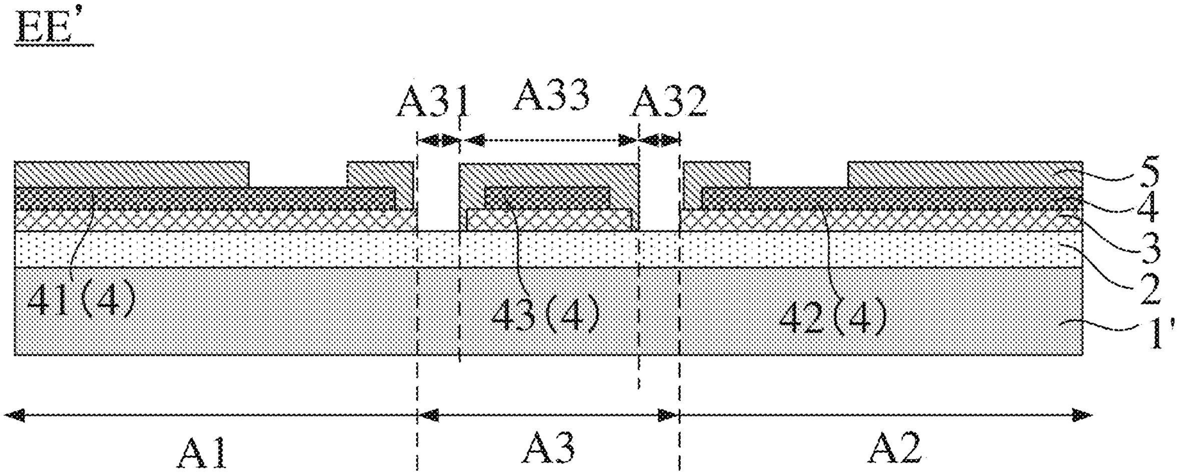
FIG. 10E is a diagram showing a step S5 of a method for manufacturing a light-emitting apparatus, in accordance with some embodiments of the present disclosure.

In S5, as shown in FIG. 10E, a first insulating layer 5 is formed on a side of the wiring layer 4 away from the flexible film 2. The first insulating layer 5 is located in the first region A1, the side region A33 and the second region A2. The first insulating layer 5 includes a plurality of first via holes, a plurality of second via holes, a plurality of third via holes and a plurality of fourth via holes.

For example, the first insulating layer 5 is made of silicon nitride, silicon oxide or silicon oxynitride. For example, the material of the first insulating layer 5 is deposited in the first region A1, the side region A33 and the second region A2 using a deposition process, and the plurality of first via holes, the plurality of second via holes, the plurality of third via holes and the plurality of fourth via holes are formed in the first insulating layer 5 through an etching process. Each first via hole exposes a portion of a surface of a first wire 41, each second via hole exposes a portion of a surface of a second wire 42, and each third via hole and each fourth via hole expose portions of a surface of a third wire 43.

Figure 10F:
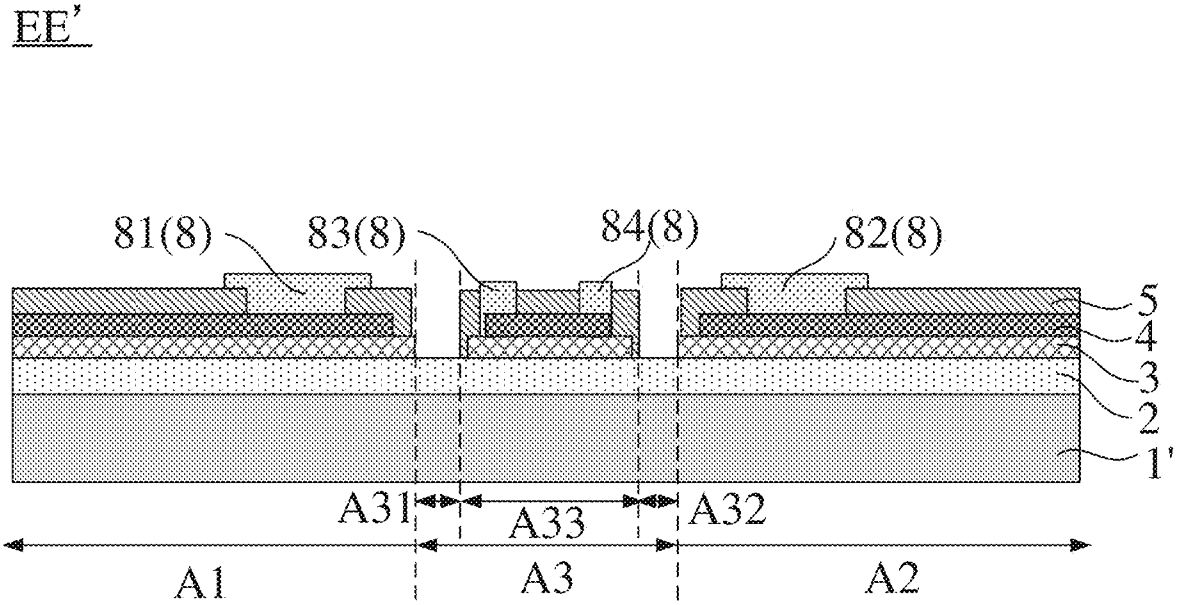
FIG. 10F is a diagram showing a step S6 of a method for manufacturing a light-emitting apparatus, in accordance with some embodiments of the present disclosure.

In S6, as shown in FIG. 10F, an electrode layer 8 is formed on a side of the first insulating layer 5 away from the initial base substrate 1'. The electrode layer 8 includes a plurality of first electrodes 81 located in the first region A1, a plurality of second electrodes 82 located in the second region A2, a plurality of third electrodes 83 located in the side region A33 and proximate to the first corner region A31, and a plurality of fourth electrodes 83 located in the side region A33 and proximate to the second corner region A32. Each third electrode 83 is electrically connected to a fourth electrode 84 through the wiring layer 4.

For example, the electrode layer 8 is made of at least one of copper, molybdenum, titanium, or aluminum. The material of the electrode layer 8 is sputtered on the surface of the first insulating layer 5 using a sputtering process, and the plurality of first electrode 81, the plurality of second electrodes 82, the plurality of third electrodes 83 and the plurality of fourth electrodes are formed using a patterning process, so that the first electrode 81 is electrically connected to a part of the wiring layer 4 located in the first region A1 (the first wire 41) through a first via hole penetrating the first insulating layer 5, the second electrode 82 is electrically connected to a portion (the second wire 42) of the wiring layer 4 located in the second region A2 through a second via hole penetrating the first insulating layer 5, and the third electrode 83 and the fourth electrode 84 are electrically connected to a portion (the third wire 43) of the wiring layer 4 located in the side region A33 through a third via hole and a fourth via hole penetrating the first insulating layer 5, respectively.

Figure 10G:
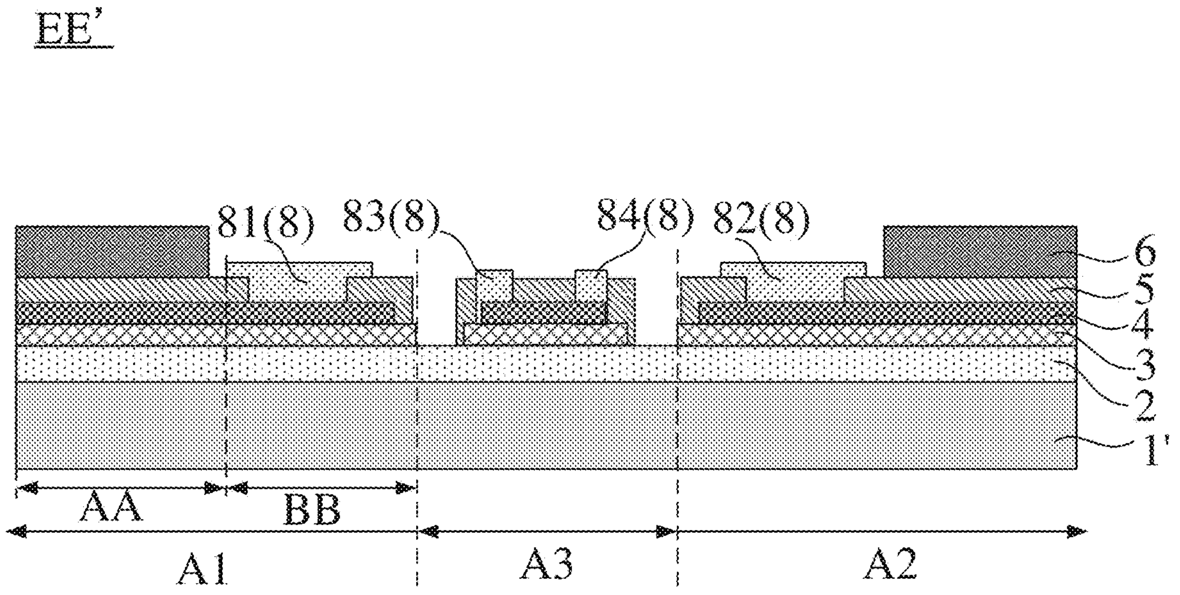
FIG. 10G is a diagram showing a step S7 of a method for manufacturing a light-emitting apparatus, in accordance with some embodiments of the present disclosure.

In S7, as shown in FIG. 10G, an organic layer 6 is formed on a side of the electrode layer 8 away from the initial base substrate 1', and the organic layer 6 is located in the first region A1 and the second region A2.

For example, the organic layer 6 is made of a resin material, and the organic layer 6 is formed on the side of the electrode layer 8 away from the initial base substrate 1' using a coating process.

In some embodiments, the first region A1 of the driving substrate 100 includes a display region AA and a peripheral region BB, and the organic layer 6 is disposed in the display region AA.

Figure 10H:
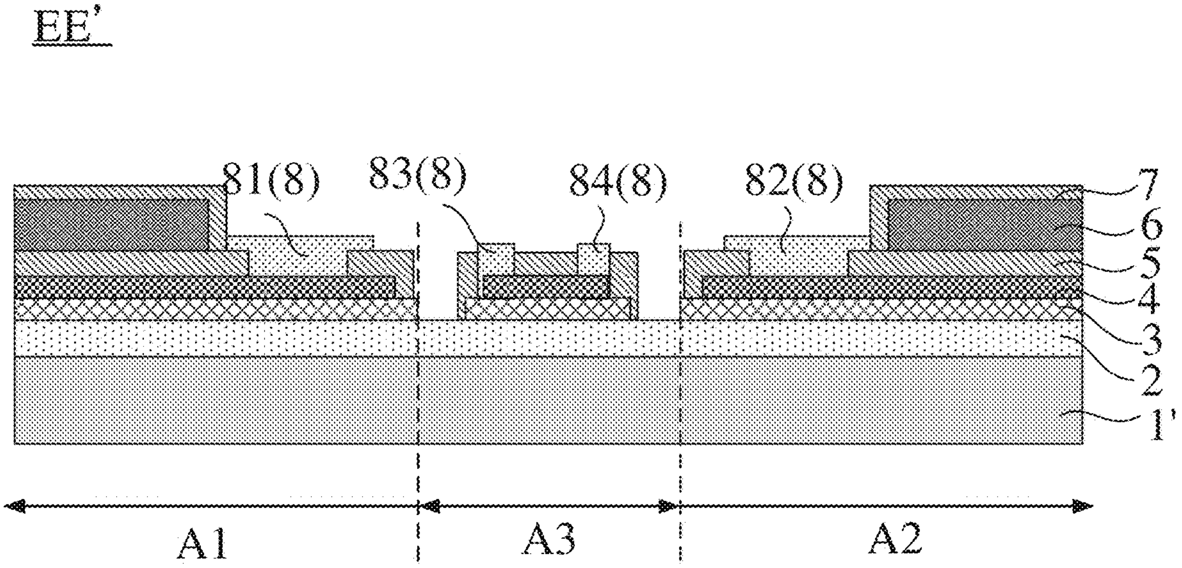
FIG. 10H is a diagram showing a step S8 of a method for manufacturing a light-emitting apparatus, in accordance with some embodiments of the present disclosure.

In S8, as shown in FIG. 10H, a second insulating layer 7 is formed on a side of the organic layer 6 away from the initial base substrate 1', and the second insulating layer 7 is located in the first region A1 and the second region A2.

For example, the second insulating layer 7 is made of silicon nitride, silicon oxide or silicon oxynitride. For example, the material of the second insulating layer 7 is deposited in the first region A1 and the second region A2 using a deposition process to form the second insulating layer 7.

Figure 10I:
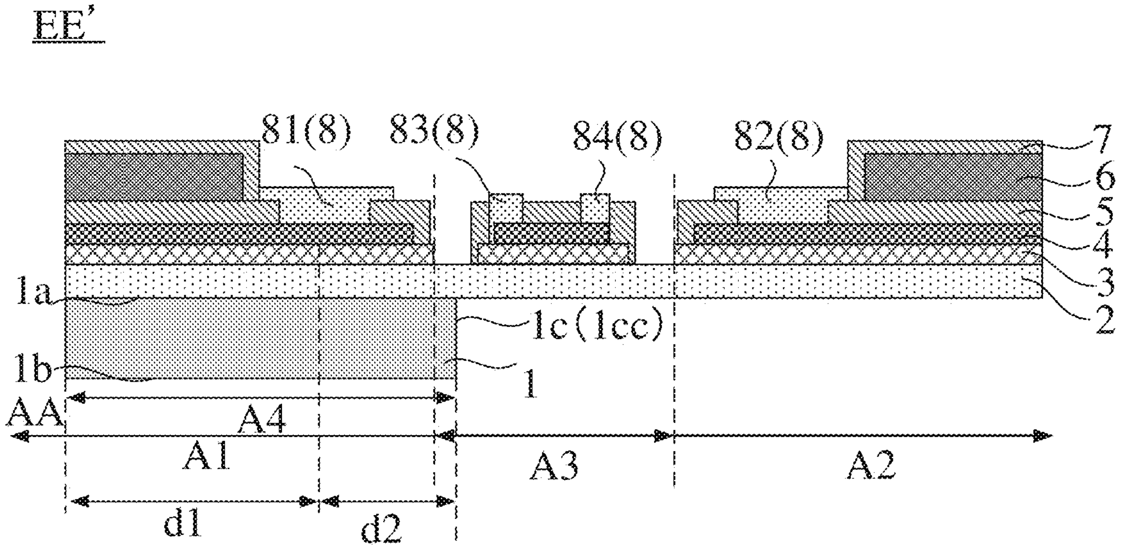
FIG. 10I is a diagram showing a step S9 of a method for manufacturing a light-emitting apparatus, in accordance with some embodiments of the present disclosure.

In S9, as shown in FIG. 10I, the bending region A3 and the second region A2 of the flexible film 2 are stripped, and a portion of the initial base substrate 1' in the to-be-removed region A5 is removed to form the base substrate 1; the base substrate 1 includes a first surface 1*a* and a second surface 1*b* that are opposite to each other and a plurality of side surfaces 1*c* connecting the first surface 1*a* and the second surface 1*b*, and at least one side surface of the plurality of side surfaces 1*c* is a selected side surface 1*cc*.

For example, the portion of the initial base substrate 1' in the to-be-removed region A5 is removed, and a portion of the initial base substrate 1' in the reserved region A4 is used as the base substrate 1. For example, a boundary line of the reserved region A4 and the to-be-removed region A5 is located in the bending region A3 and proximate to the first region A1. In this way, in the subsequent steps, after the flexible film 2 is bent, the portions of the flexible film 2 located in the bending region A3 and the second region A2 are respectively attached to the selected side surface 1*cc* and second surface 1*b* of the base substrate 1.

In some examples, S9 includes as follows.

In S91, a portion of the flexible film 2 corresponding to the to-be-removed region of the initial base substrate 1' is stripped at least.

In S92, the portion of the initial base substrate 1' in the to-be-removed region is removed using a cutting process.

As shown in FIG. 10I, a boundary line between a stripped region and a non-stripped region of the flexible film 2 is closer to the display region AA than a boundary line between the reserved region A4 and the to-be-removed region A5 of the initial base substrate 1'. For example, there is a first distance d1 between the boundary line between the stripped region and the non-stripped region of the flexible film 2 and the display region AA, and there is a second distance d2 between the boundary line between the reserved region A4 and the to-be-removed region A5 of the initial base substrate 1' and the boundary line between the stripped region and the non-stripped region of the flexible film 2, values of the first distance d1 and the second distance d2 depend on the accuracy of the stripping process and the cutting process. For example, the first distance d1 and the second distance d2 are each 30 μm, thus ensuring the smooth stripping progress of the flexible film 2 and cutting the initial base substrate 1'.

Figure 10J:
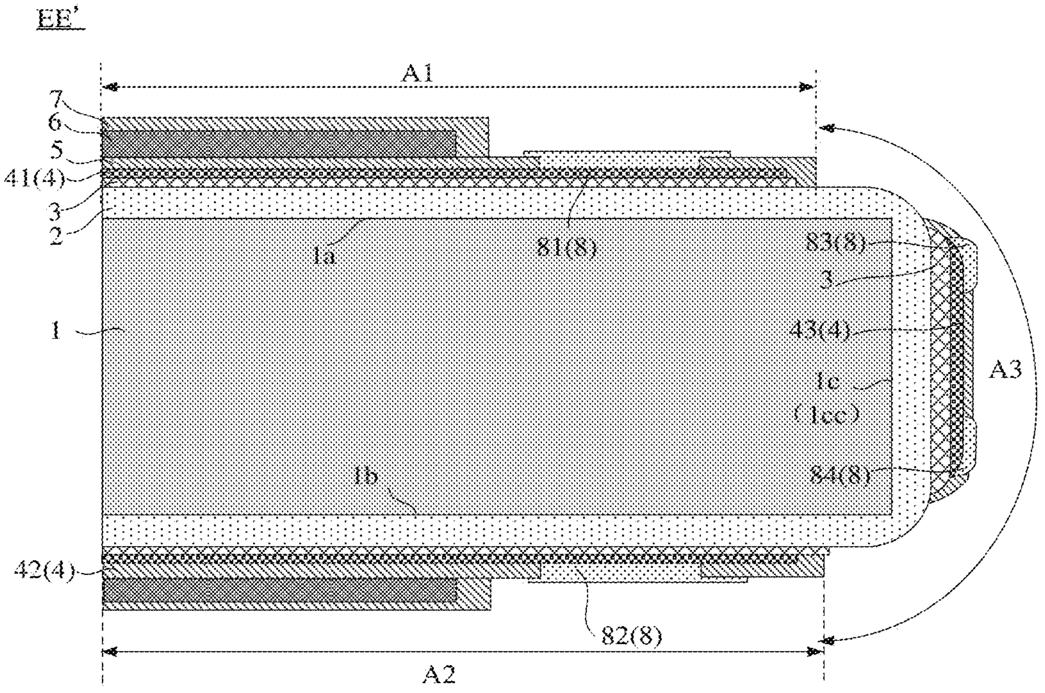
FIG. 10J is a diagram showing a step S10 of a method for manufacturing a light-emitting apparatus, in accordance with some embodiments of the present disclosure.

In S10, as shown in FIG. 10J, the flexible film 2 is bent, so that portions of the flexible film 2 located in the bending region A3 and the second region A2 are respectively attached to the selected side surface 1*cc* and the second surface 1*b* of the base substrate 1.

For example, using two arrises of the base substrate 1 as centers, the flexible film 2 is bent twice at 90°, so that the portions of the flexible film 2 located in the bending region A3 and the second region A2 are respectively attached to the selected side surface 1*cc* and the second surface 1*b* of the base substrate 1. Film layers stacked on the flexible film 2 also change correspondingly with the bending position of the flexible film 2.

In this case, a part of the driving substrate 100 located in the bending region A3 only includes the flexible film 2 with high bending performance, and an electrical communication relationship between the first region A1 and the second region A2 is not formed. Therefore, during the bending process, the bending effect can be guaranteed without film breakage or cracks. The first electrodes 81 and the second electrodes 82 are located on the first surface 1*a* and the second surface 1*b* of the base substrate 1, respectively.

Figure 10K:
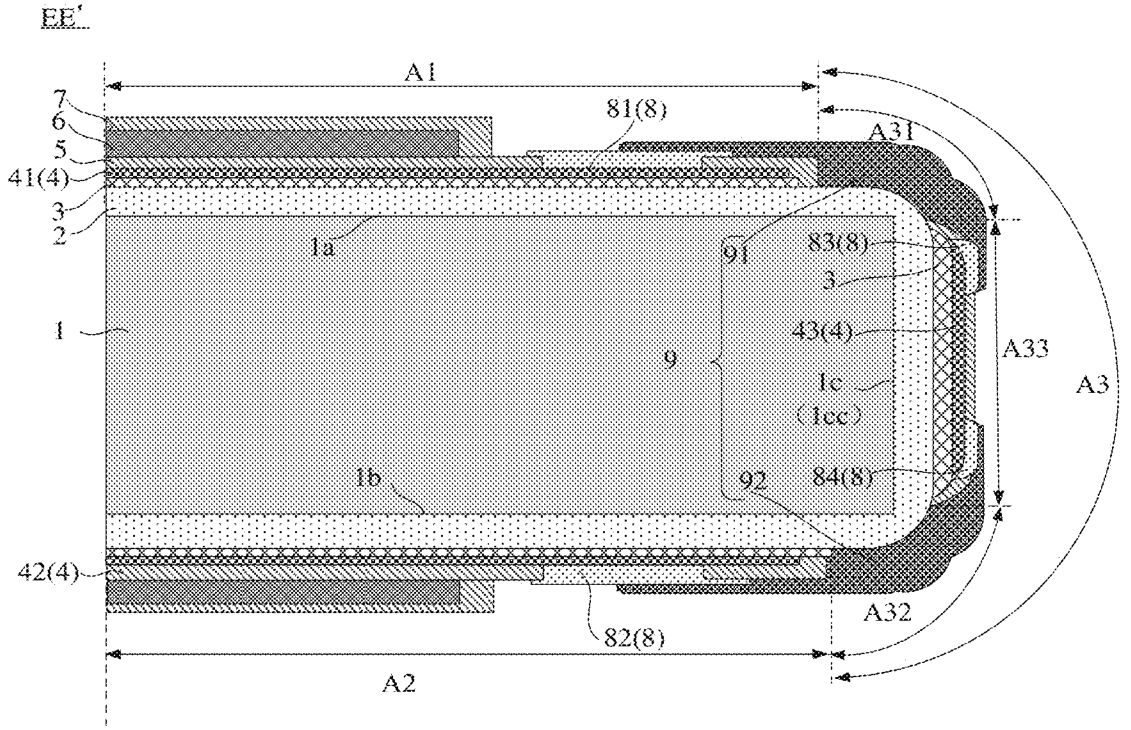
FIG. 10K is a diagram showing a step S11 of a method for manufacturing a light-emitting apparatus, in accordance with some embodiments of the present disclosure.

In S11, as shown in FIG. 10K, a connection lead layer 9 is formed on the side of the flexible film 2 away from the base substrate 1; the connection lead layer 9 includes a plurality of first connection leads 91 and a plurality of second connection leads 92, each first connection lead 91 and each second connection lead 92 are respectively located in the first corner region A31 and the second corner region A32; two ends of each first connection lead 91 extend to the first region A1 and the side region A33, respectively; two ends of each second connection lead 92 extend to the second region A2 and the side region A33, respectively; each first connection lead 91 is connected to a first electrode 81 of the plurality of first electrodes 81 and a third electrode 83 of the plurality of third electrodes 83; and each second connection lead 92 is electrically connected to a second electrode 82 of the plurality of second electrodes 82 and a fourth electrode 84 of the plurality of fourth electrodes 84.

For example, the connection lead layer 9 is formed by using a three-dimensional printing process to print the plurality of first connection leads 91 and the plurality of second connection leads 92. In the process of forming the connection lead layer 9, only two printing processes are required, to realize the signal transmission between the first region A1 and the second region A2. Compared with the existing method for printing the connection leads, one printing process can be omitted, and the printing efficiency is improved.

Figure 10L:
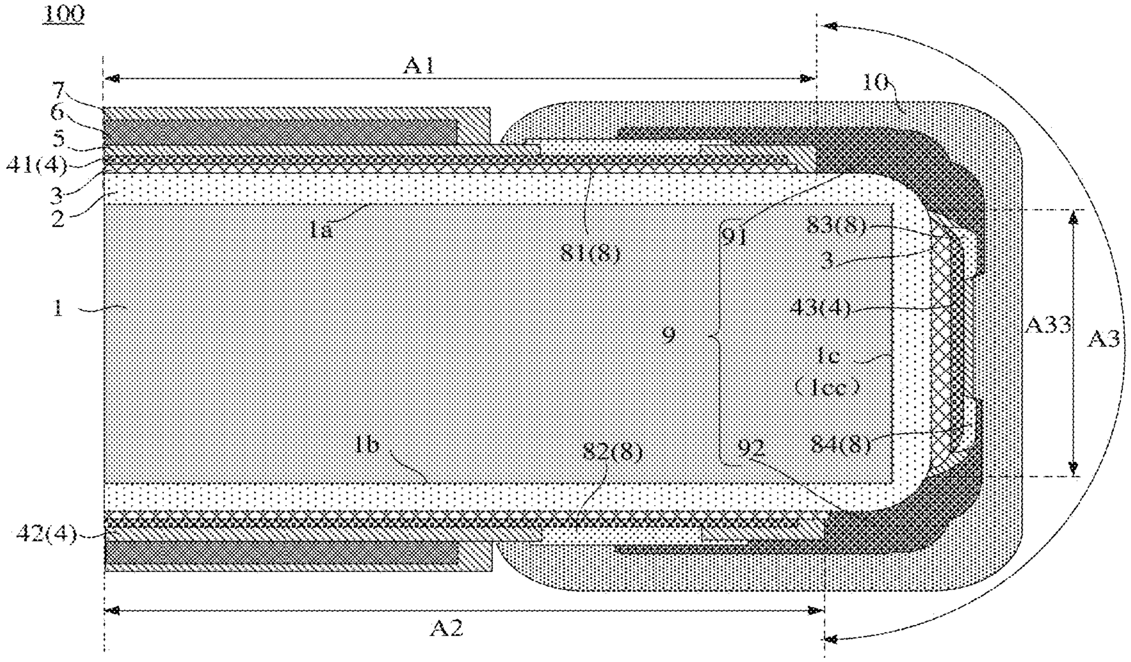
FIG. 10L is a diagram showing a step S12 of a method for manufacturing a light-emitting apparatus, in accordance with some embodiments of the present disclosure.

In S12, as shown in FIG. 10L, a protective layer 10 is formed. The protective layer 10 covers the connection lead layer 9, the wiring layer 4 and the electrode layer 8.

As shown in FIG. 10L, the protective layer 10 is disposed on the side of the connection lead layer 9 away from the base substrate 1. The protective layer 10 covers the plurality of first connection leads 91 and the plurality of second connection leads 92, which can protect the plurality of first connection leads 91 and the plurality of second connection leads 92, thus blocking water and oxygen, preventing the plurality of first connection leads 91 and the plurality of second connection leads 92 from being corroded by water and oxygen, and prolonging the service life.

It should be noted that the plurality of first connection leads 91 at least partially overlap with the first electrodes 81 and the third electrodes 83 of the electrode layer 8, that is, it is ensured that the plurality of first connection leads 91 can realize the communications between the first electrodes 81 and the third electrodes 83. With continued reference to FIG. 10L, the plurality of first connection leads 91 partially overlap with the first electrodes 81 and the third electrodes 83 of the electrode layer 8. That is, before the protective layer 10 is formed, surfaces, away from the base substrate 1, of the first electrodes 81 and the third electrodes 83 are partially exposed; similarly, surfaces, away from the base substrate 1, of the second electrodes 82 and the fourth electrodes 84 are partially exposed. Therefore, the protective layer 10 is provided to cover the electrode layer 8, which can protect some parts of the first electrodes 81, the second electrodes 82, the third electrodes 83 and the fourth electrodes 84, so as to avoid water and oxygen corrosion and prolong service life.

With continued reference to FIG. 10L, the wiring layer 4 includes first wires 41 located in the first region A1, second wires 42 in the second region A2, and third wires 43 in the side region A33; before the protective layer 10 is formed, the third wires 43 of the wiring layer 4 are used to realize electrical signal transmission between the third electrodes 83 and the third electrodes 84; and the third wires 43 are exposed. Therefore, after the protective layer 10 is provided, the protective layer 10 covers the third wires 43, to avoid water and oxygen corrosion, prolong the service life, and in turn improve the overall performance of the driving substrate 100.

For example, a printing process, a transfer printing process, a deposition process, etc. may be used to form the protective layer 10 on a side of the connection lead layer 9, the wiring layer 4 and the electrode layer 8 away from the base substrate 1.

In some embodiments, referring to FIG. 9, the method for manufacturing the light-emitting apparatus further includes as follows.

In S13, a plurality of light-emitting devices 20 are provided in the first region A1 of the driving substrate.

For example, the light-emitting devices 20 are electrically connected to a part of the wiring layer 4 located in the first region A1 (the plurality of first wires 41). For example, as shown in FIG. 9, the part of the wiring layer 4 located in the first region A1 includes a first wiring layer 4" and a second wiring layer 4', the second wiring layer 4' is electrically connected to the first wiring layer 4" through opening(s) penetrating the second insulating layer 7, the organic layer 6 and the first insulating layer 5, and the light-emitting devices 20 are in direct contact with and electrically connected to the second wiring layer 4'.

In S14, a first adhesive layer 12B is formed on a side of the light-emitting devices 20 away from the base substrate 1, and a second adhesive layer 12A is formed on side walls of the light-emitting devices 20.

For example, a coating process is used to coat the second adhesive layer 12A between two adjacent light-emitting devices 20, and the side of the light-emitting devices 20 away from the base substrate 1 is coated with the first adhesive layer 12B.

In S15, a driver circuit board 200 is bonded to the second region A2. For example, the driver circuit board 200 is electrically connected to the plurality of bonding electrodes 85, through a part of the wiring layer 4 (the first wiring layer 4") located in the second region A2 (the plurality of second wires 42) is electrically connected to the plurality of second electrodes 82 to realize the bonding of the driver circuit board 200.

It should be noted that the above-mentioned S13, S14 and S15 are not necessarily in a continuous relationship with steps S1 to S12. Two implementations of the overall manufacturing process of the light-emitting apparatus are introduced below.

In some embodiments, the overall manufacturing process of the light-emitting apparatus is that after S8 and before S9, steps S13 and S14 are performed, then steps S9 to S12 are performed, and then S15 is finished. That is, after the flexible film 2, the buffer layer 3, the wiring layer 4, the first insulating layer 5, the organic layer 6 and the second insulating layer 7 are formed on the initial base substrate 1', the plurality of light-emitting devices 20 are transferred to a side of the second insulating layer 7 away from the initial base substrate 1', the light-emitting devices 20 being electrically connected to the part of the wiring layer 4 located in the first region A1, and the first adhesive layer 12B and the second adhesive layer 12A are formed; and the above steps are all performed in a case of the non-bending state of the driving substrate. Then, the initial base substrate 1' is cut to obtain the base substrate 1, the flexible film 2 is bent, the connection lead layer 9 and the protective layer 10 are formed, and then the bonding of the driver circuit board 200 is finished.

In some other embodiments, the overall manufacturing process of the light-emitting apparatus is S1 to S15. That is, after the flexible film 2, the buffer layer 3, the wiring layer 4, the first insulating layer 5, the organic layer 6, and the second insulating layer 7 are formed on the initial base substrate 1', the initial base substrate 1' is cut to obtain the base substrate 1, the flexible film 2 is bent such that the driving substrate is in a bending state, the connection lead layer 9 and the protective layer 10 are formed, the plurality of light-emitting devices 20 are transferred to the side of the second insulating layer 7 away from the base substrate 1, the light-emitting devices 20 being electrically connected to the part of the wiring layer 4 located in the first region A1, the first adhesive layer 12B and the second adhesive layer 12A are formed, and then the bonding of the driver circuit board 200 is finished.

In the method for manufacturing the light-emitting apparatus provided in the present disclosure, the flexible film 2 is first bent and then the connection lead layer 9 is formed on the side of the electrode layer 8 away from the base substrate 1, that is, before the flexible film 2 is bent, no metal wires are provided in the first corner region A31 and the second corner region A32, and the connection lead layer 9 is formed after the bending. In this way, it avoids the problem of breakage due to the increase of the stress on the connection leads on the surface of the flexible film 2 during the process of bending the flexible film 2 in the related art. Therefore, the connection stability of the plurality of connection leads is guaranteed without increasing the difficulty of the process. In addition, before the bending, the third electrodes 83 and the fourth electrodes 84 are provided in the electrode layer 8, and the third wires 43 are provided in the side region A33, which realizes the electrical connections between the third electrodes 83 and the fourth electrodes 84. In the subsequent process of forming the connection lead layer 9, the process can be further simplified, the stability of signal transmission is guaranteed, and the reliability of the driving substrate 100 is enhanced.

The foregoing descriptions are merely specific implementation manners of the present disclosure, but the protection scope of the present disclosure is not limited thereto. Any changes or replacements that a person skilled in the art could conceive of within the technical scope of the present disclosure shall be included in the protection scope of the present disclosure. Therefore, the protection scope of the present disclosure shall be subject to the protection scope of the claims.

What is claimed is:

1. A driving substrate, comprising:

a base substrate including a first surface and a second surface that are opposite to each other and a plurality of side surfaces, at least one of the plurality of side surfaces being a selected side surface;

a flexible film disposed on the first surface, the selected side surface, and a portion of the second surface proximate to the selected side surface, wherein the flexible film includes a first region located on the first surface, a second region located on the second surface, and a bending region located between the first region and the second region; the bending region includes a first corner region, a second corner region and a side region connecting the first region and the second region; and a wiring layer, an electrode layer and a connection lead layer disposed in sequence on a side of the flexible film away from the base substrate;

wherein the wiring layer is located in the first region, the second region and the side region; the electrode layer includes a plurality of first electrodes located in the first region, a plurality of second electrodes located in the second region, a plurality of third electrodes located in the side region and proximate to the first corner region, and a plurality of fourth electrodes located in the side region and proximate to the second corner region; each third electrode is electrically connected to a fourth electrode through the wiring layer;

the connection lead layer includes a plurality of first connection leads and a plurality of second connection leads; the plurality of first connection leads are located in the first corner region, and two ends of each first connection lead respectively extend to the first region and the side region; each first connection lead connects a first electrode and a third electrode; the plurality of second connection leads are located in the second corner region, and two ends of each second connection lead respectively extend to the second region and the side region; and each second connection lead connects a second electrode and a fourth electrode.

2. The driving substrate according to claim 1, further comprising at least one inorganic layer and/or at least one organic layer disposed on the side of the flexible film away from the base substrate, wherein the inorganic layer is located in the first region, the second region and the side region, and the organic layer is located in the first region and the second region; and the connection lead layer is in contact with the flexible film.

3. The driving substrate according to claim 1, wherein a thickness of the connection lead layer is in a range of 2 μm to 5 μm.

4. The driving substrate according to claim 1, wherein widths of the plurality of first connection leads are approximately the same, and widths of the plurality of second connection leads are approximately the same.

5. The driving substrate according to claim 2, wherein the driving substrate comprises an organic layer, and the organic layer is disposed on a side of the electrode layer away from the base substrate.

6. The driving substrate according to claim 5, wherein the driving substrate further comprises the at least one inorganic layer, and the at least one inorganic layer includes:

a buffer layer disposed between the flexible film and the wiring layer, the buffer layer being located in the first region, the side region and the second region;

a first insulating layer disposed between the wiring layer and the electrode layer, the first insulating layer being located in the first region, the side region and the second region, wherein the first electrode is electrically connected to a portion of the wiring layer located in the first region through a first via hole penetrating the first insulating layer; the second electrode is electrically connected to a portion of the wiring layer located in the second region through a second via hole penetrating the first insulating layer; and the third electrode and the fourth electrode are connected to a portion of the wiring layer located in the side region through a third via hole and a fourth via hole penetrating the first insulating layer, respectively; and a second insulating layer disposed on a side of the inorganic layer away from the base substrate, the second insulating layer being located in the first region and the second region.

7. The driving substrate according to claim 1, wherein the wiring layer includes a plurality of first wires disposed in the first region, a plurality of second wires disposed in the second region, and a plurality of third wires disposed in the side region; and each of the third wires is electrically connected to a third electrode of the plurality of third electrodes and a fourth electrode of the plurality of fourth electrodes.

8. The driving substrate according to claim 1, wherein a size of the first electrode in an extending direction of the first electrode is in a range of 50 μm to 100 μm.

9. The driving substrate according to claim 1, wherein a size of the third electrode in an extending direction of the third electrode is in a range of 30 μm to 50 μm, and a size of the fourth electrode in an extending direction of the fourth electrode is in a range of 30 μm to 50 μm.

10. The driving substrate according to claim 1, wherein a distance between a boundary line of the first region and the first corner region and the selected side surface is in a range of 15 μm to 25 μm; and/or a distance between a boundary line of the second region and the second corner region and the selected side surface is in a range of 15 μm to 25 μm.

11. The driving substrate according to claim 1, further comprising a protective layer located in the bending region, a portion of the first region proximate to the bending region, and a portion of the second region proximate to the bending region, the protective layer covering the connection lead layer, the wiring layer and the electrode layer.

12. The driving substrate according to claim 1, further comprising: a plurality of bonding electrodes disposed on the side of the flexible film away from the base substrate, the plurality of bonding electrodes being electrically connected to the plurality of second electrodes.

13. The driving substrate according to claim 12, wherein a size of each bonding electrode is less than a size of each second electrode.

14. The driving substrate according to claim 12, wherein a distance between two adjacent bonding electrodes is less than a distance between two adjacent second electrodes.

15. A light-emitting apparatus, comprising:

the driving substrate according to claim 1;

a plurality of light-emitting devices located on the first surface, the plurality of light-emitting devices being electrically connected to the plurality of first electrodes; and a driver circuit board located on the second surface, the driver circuit board being electrically connected to the plurality of second electrodes.

16. A method for manufacturing a light-emitting apparatus, the method comprising:

providing an initial base substrate, wherein the initial base substrate includes an initial first surface and an initial second surface that are opposite to each other, and the initial base substrate includes a reserved region and a to-be-removed region;

forming a flexible film on the initial first surface of the initial base substrate, wherein the flexible film includes a first region, a second region, and a bending region between the first region and the second region; and the bending region includes a first corner region, a second corner region, and a side region located between the first corner region and the second corner region;

forming a wiring layer on a side of the flexible film away from the initial base substrate, the wiring layer being located in the first region, the second region and the side region;

forming an electrode layer on a side of the wiring layer away from the initial base substrate, wherein the electrode layer includes a plurality of first electrodes located in the first region, a plurality of second electrodes located in the second region, a plurality of third electrodes located in the side region and proximate to the first corner region, and a plurality of fourth electrodes located in the side region and proximate to the second corner region; each third electrode is electrically connected to a fourth electrode through the wiring layer;

stripping off the bending region and the second region of the flexible film and removing a portion of the initial base substrate in the to-be-removed region to form a base substrate, wherein the base substrate includes a first surface and a second surface that are opposite to each other and a plurality of side surfaces connecting the first surface and the second surface, at least one side surface of the plurality of side surfaces being a selected side surface;

bending the flexible film so that portions of the flexible film located in the bending region and the second region are respectively attached to the selected side surface and the second surface of the base substrate; and forming a connection lead layer on the side of the flexible film away from the base substrate, wherein the connection lead layer includes a plurality of first connection leads and a plurality of second connection leads; two ends of each of the first connection leads respectively extend to the first region and the side region, and two ends of each of the second connection leads respectively extend to the second region and the side region; each of the first connection leads is electrically connected to a first electrode of the plurality of first electrodes and a third electrode of the plurality of third electrodes; and each of the second connection leads is electrically connected to a second electrode of the plurality of second electrodes and a fourth electrode of the plurality of fourth electrodes.

17. The method according to claim 16, wherein after forming the flexible film on the first surface of the initial base substrate and before forming the wiring layer on the side of the flexible film away from the initial base substrate, the method comprises: forming a buffer layer on the side of the flexible film away from the initial base substrate, the buffer layer being located in the first region, the side region and the second region;

after forming the wiring layer on the side of the flexible film away from the initial base substrate, the method comprises: forming a first insulating layer on the side of the wiring layer away from the flexible film, the first insulating layer being located in the first region, the side region and the second region, the first insulating layer including a plurality of first via holes, a plurality of second via holes, a plurality of third via holes and a plurality of fourth via holes;

forming the electrode layer on the side of the wiring layer away from the initial base substrate, includes:

forming the plurality of first electrodes, the plurality of second electrodes, the plurality of third electrodes and the plurality of fourth electrodes on a side of the first insulating layer away from the initial base substrate, so that the first electrode is electrically connected to a portion of the wiring layer located in the first region through a first via hole penetrating the first insulating layer; the second electrode is electrically connected to a portion of the wiring layer located in the second region through a second via hole penetrating the first insulating layer; and the third electrode and the fourth electrode are connected to a portion of the wiring layer located in the side region through a third via hole and a fourth via hole penetrating the first insulating layer, respectively;

after forming the electrode layer on the side of the wiring layer away from the initial base substrate, the method further comprises:

forming an organic layer on a side of the electrode layer away from the initial base substrate, the organic layer being located in the first region and the second region; and forming a second insulating layer on a side of the organic layer away from the initial base substrate, the second insulating layer being located in the first region and the second region.

18. The method according to claim 16, wherein forming the connection lead layer on the side of the flexible film away from the base substrate includes:

printing a plurality of first connection leads by using a three-dimensional printing process; and printing a plurality of second connection leads printed by using a three-dimensional printing process.

19. The method according to claim 16, further comprising:

after forming the connection lead layer, forming a protective layer on the connection lead layer, the wiring layer and the electrode layer.

20. The method according to claim 16, further comprising:

providing a plurality of light-emitting devices in the first region of the driving substrate;

forming a first adhesive layer on a side of the plurality of light-emitting devices away from the base substrate and forming a second adhesive layer on side walls of the plurality of light-emitting devices; and bonding a driver circuit board to the second region of the driving substrate.

* * * * *